(12) United States Patent
Daghighian et al.

(10) Patent No.: US 8,666,257 B2
(45) Date of Patent: *Mar. 4, 2014

(54) OPTOELECTRONIC DEVICES WITH INTELLIGENT TRANSMITTER MODULES

(75) Inventors: Henry Meyer Daghighian, Mountain View, CA (US); Kevin J. McCallion, Charlestown, MA (US)

(73) Assignee: Finisar Corporation, Sunnyvale, CA (US)

( * ) Notice: Subject to any disclaimer, the term of this patent is extended or adjusted under 35 U.S.C. 154(b) by 1211 days.

This patent is subject to a terminal disclaimer.

(21) Appl. No.: 12/130,123

(22) Filed: May 30, 2008

(65) Prior Publication Data

US 2008/0292322 A1   Nov. 27, 2008

Related U.S. Application Data

(63) Continuation-in-part of application No. 11/968,581, filed on Jan. 2, 2008.

(60) Provisional application No. 60/940,043, filed on May 24, 2007.

(51) Int. Cl.
*H04B 10/00* (2013.01)

(52) U.S. Cl.
USPC ........... 398/138; 398/135; 398/130; 398/158; 398/140

(58) Field of Classification Search
USPC ............. 398/25, 33, 135–141, 164, 128, 130, 398/158, 159, 160
See application file for complete search history.

(56) References Cited

U.S. PATENT DOCUMENTS

| | | | | |
|---|---|---|---|---|
| 6,731,880 B2* | 5/2004 | Westbrook et al. | ........... | 398/115 |
| 6,947,672 B2 | 9/2005 | Jiang et al. | | |
| 7,031,051 B2* | 4/2006 | Liu et al. | ............. | 359/341.2 |
| 7,155,127 B2* | 12/2006 | Akimoto et al. | ........... | 398/72 |
| 7,371,014 B2* | 5/2008 | Willis et al. | ........... | 385/89 |
| 8,019,225 B2* | 9/2011 | Daghighian et al. | ........ | 398/135 |

(Continued)

OTHER PUBLICATIONS

U.S. Appl. No. 11/968,581, filed Jan. 2, 2008, Henry Daghighian.

(Continued)

*Primary Examiner* — M. R. Sedighian
(74) *Attorney, Agent, or Firm* — Maschoff Brennan

(57) ABSTRACT

An optoelectronic device can implement an intelligent transmitter module ("ITM"), rather than a conventional TOSA, for the transmission of optical data signals. The ITM can include an optical transmitter, a CDR and driver IC, and a microcontroller and/or linear amplifier. Space available in the optoelectronic device due to using an ITM rather than a TOSA and PCB-bound CDR, driver, microcontroller, and/or linear amplifier can be used for the inclusion of one or more electronic and/or optical components. Electronic components that can be included in a device with an ITM include: an FPGA, a DSP, a memory chip, a digital diagnostic IC, a video IC, a wireless interface, and an RF interface. Optical components that can be included in a device with an ITM include: a VOA, an SOA, a MUX, a DEMUX, a polarization controller, and an optical power monitoring device.

19 Claims, 12 Drawing Sheets

(56) References Cited

U.S. PATENT DOCUMENTS

| | | | |
|---|---|---|---|
| 2003/0219255 A1* | 11/2003 | Jaggi et al. | 398/139 |
| 2004/0197055 A1 | 10/2004 | Fischer et al. | |
| 2004/0202476 A1* | 10/2004 | Woolf et al. | 398/135 |
| 2006/0002415 A1 | 1/2006 | Heston et al. | |
| 2006/0067705 A1 | 3/2006 | Paulsen | |
| 2006/0147215 A1* | 7/2006 | Hahin et al. | 398/135 |
| 2006/0159462 A1* | 7/2006 | Aronson et al. | 398/138 |
| 2006/0239690 A1* | 10/2006 | Dybsetter et al. | 398/135 |
| 2006/0263092 A1* | 11/2006 | Hosking et al. | 398/135 |
| 2007/0127928 A1* | 6/2007 | Varshneya et al. | 398/135 |
| 2008/0037594 A1* | 2/2008 | Hornbuckle et al. | 370/537 |

OTHER PUBLICATIONS

Chris H. Dick, Design and implementation of high-performance FPGA signal processing datapaths for software-defined radios, VMEbus Systems, Aug. 2001.

Tapan J. Chakraborty and Chen-Huan Chiang, A Novel Fault Injection Method for System Verification Based on FPGA Boundary Scan Architecture, ITC International Test Conference, 2002, pp. 923-929.

Jim Jackson, Fiber Optics System, EVLA Project Book, Chapter 7, Aug. 2001.

U.S. Appl. No. 11/968,581, Sep. 30, 2010, Non-Final Office Action.

* cited by examiner

OPTOELECTRONIC DEVICES WITH INTELLIGENT TRANSMITTER MODULES

CROSS-REFERENCE TO RELATED APPLICATIONS

This application is a continuation-in-part of U.S. patent application Ser. No. 11/968,581, entitled INTELLIGENT TRANSMITTER MODULE, filed on Jan. 2, 2008, which in turn claims the benefit of U.S. Provisional Patent Application Ser. No. 60/940,043, entitled INTEGRATED TRANSMITTER OPTICAL SUBASSEMBLY, filed on May 24, 2007. The foregoing applications are incorporated herein by reference in their entirety.

BACKGROUND OF THE INVENTION

1. The Field of the Invention

The present invention relates generally to devices for high speed data transmission. More particularly, embodiments of the invention concern optoelectronic devices having one or more intelligent transmitter modules and specialized functionality.

2. The Relevant Technology

Computing, telecom and networking technology have transformed our world. As the amount of information communicated over networks has increased, high speed transmission has become ever more critical. Many high speed data transmission networks rely on optical transceivers and similar devices for facilitating transmission and reception of digital data embodied in the form of optical signals over optical fibers. Optical networks are thus found in a wide variety of high speed applications ranging from modest Local Area Networks ("LANs") to backbones that define a large portion of the infrastructure of the Internet.

Typically, data transmission in such networks is implemented by way of an optical transmitter, such as a laser or Light Emitting Diode ("LED"). The optical transmitter emits light when current is passed through it, the intensity of the emitted light being a function of the magnitude of the current. Data reception is generally implemented by way of an optical receiver, an example of which is a photodiode. The optical receiver receives light and generates a current, the magnitude of the generated current being a function of the intensity of the received light.

Various other components are also employed by the optical transceiver to aid in the control of the optical transmit and receive components, as well as the processing of various data and other signals. For example, such optical transceivers typically include a driver (e.g. referred to as a "laser driver" when used to drive a laser signal) configured to control the operation of the optical transmitter in response to various control inputs. The optical transceiver also generally includes an amplifier (e.g. often referred to as a "post-amplifier") configured to amplify the channel-attenuated received signal prior to further processing. A controller circuit (hereinafter referred to as the "microcontroller") controls the operation of the laser driver and post-amplifier. A clock and data recovery circuit (hereinafter referred to as the "CDR") may also be used in telecommunication applications (e.g., SONET networks) to equalize and retime electrical data signals prior to transmission as optical signals.

Two often conflicting demands in the market for components used in optical networks are the demands for higher transmission speeds and miniaturization. The conflict is evident, for example, in trying to design modules suitable for use in SONET applications that can also achieve 10 G and above telecommunication data transmission speeds. The high-speed nature of signal transmission demands a minimum number of electronic interconnects with a short path for electrical transmission between the components of the module. Electronic interconnects in the form of leads, flex circuits, and piecewise continuous ground connections pose a major challenge in meeting SONET jitter performance due to reflections and bandwidth limitations. Electromagnetic compliance on the transmit side (e.g., CDR, laser driver, transmitter) is also a major challenge due to high frequency signal generation and reflections at each interface, which can be major sources of EMI emissions at 10 G data rates.

The current dominant technology for achieving long haul (>80 km) optical transmission at and above 10 G data rates implements Lithium Niobate Mach-Zehnder and InP Mach Zehnder modulators. Typically, however, modules implementing this technology are relatively expensive, large, and power hungry. One alternative solution for achieving 10 G data rates in applications less than 100 km involves the use of directly modulated lasers ("DMLs") or externally modulated lasers ("EMLs"), which are often less expensive, smaller and less power hungry than Lithium Niobate Mach-Zehnder and InP Mach Zehnder modulators. However, adiabatic chirp generated in distributed feedback lasers due to RF pickup and back reflection and transient chirp in the modulator section cause rapid distortion of the eye after fiber propagation. As a result, conventional DMLs and EMLs remain limited to applications less than 100 km.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY OF THE INVENTION

These and other limitations are overcome by embodiments of the invention which relate to systems and methods for high speed data transmission. More particularly, embodiments of the invention are directed to optoelectronic devices having an intelligent transmitter module ("ITM") rather than a conventional TOSA, CDR, driver, and microcontroller and/or linear amplifier. Briefly, an ITM is a TOSA-like device that can include an optical transmitter, a CDR and driver IC, and a microcontroller and/or linear amplifier. Similar to a conventional TOSA, an ITM receives an electrical data signal and emits an optical data signal. In contrast to a conventional TOSA, however, an ITM additionally includes electronic components for equalizing and retiming the electrical data signal and performing waveform shaping of the electrical data signal. Embodiments of an ITM can also include electronic components for at least one of: monitoring and controlling the ITM (e.g., using a microcontroller), and amplifying the electrical data signal (e.g., using a linear amplifier) prior to being received by the optical transmitter.

Some or all of the above-described electronic components can be integrated within the ITM and configured in a manner that reduces the amount of space they occupy and the amount of power they consume compared to their conventional counterparts. Consequently, as compared to an optoelectronic device with a conventional TOSA, an optoelectronic device with an ITM can include one or more additional electronic and/or optical components without requiring additional space and/or power budget. Electronic components that can be included within an optoelectronic device having an ITM include: an FPGA, a DSP, a memory chip, a digital diagnostic IC, a video IC, a wireless interface, and an RF interface. Optical components that can be included within an optoelectronic device with an ITM include: a VOA, a booster or pre-amplifier (e.g., an SOA), an optical multiplexer, an optical demultiplexer, a polarization controller, and an optical power monitoring device (e.g., a photodetector).

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

Reference will now be made to the drawings to describe various aspects of exemplary embodiments of the invention. It should be understood that the drawings are diagrammatic and schematic representations of such exemplary embodiments and, accordingly, are not limiting of the scope of the present invention, nor are the drawings necessarily drawn to scale.

Embodiments of the invention relate to optoelectronic devices such as transceivers and transponders that implement an intelligent transmitter module ("ITM") rather than a conventional transmitter optical subassembly ("TOSA") for the transmission of optical signals. Briefly, an ITM according to one embodiment of the invention includes an optical transmitter and one or more electronic components typically found on the printed circuit board ("PCB") of a conventional optoelectronic device, such as a CDR and laser driver. The ITM may also include a linear amplifier and/or a microcontroller. By removing the one or more electronic components from the PCB, real estate is made available on the PCB for the addition of one or more electronic components, such as a field programmable gate array ("FPGA"), a digital signal processor ("DSP"), a memory chip, a diagnostic integrated circuit ("IC"), a video IC, a wireless network interface and an RF on fiber interface. Alternately or additionally, the size of the PCB can be reduced to make room within an optoelectronic device for one or more optical components, such as: a variable optical attenuator ("VOA"), a semiconductor optical amplifier ("SOA"), an optical multiplexer ("MUX") and/or demultiplexer ("DEMUX"), and a polarization controller.

Embodiments of the invention can be implemented in various optoelectronic devices. As used herein, the term "optoelectronic device" includes devices having both optical and electrical components. Examples of optoelectronic devices include, but are not limited to transponders, transceivers, transmitters, and/or receivers. Optoelectronic devices can be used, for example, in telecommunications networks, local area networks, metro area networks, storage area networks, wide area networks, and the like. The principles of the present invention may be implemented in optoelectronic devices of any form factor currently available or that may be developed in the future for 10 G, 40 G, and 100 G signaling, without restriction. It will be appreciated, however, that the optoelectronic devices need not comply with standardized form factor requirements and may have any size or configuration necessary according to a particular design. The principles of the present invention are suitable for use with, for example, 10 G, 40 G and other transmission speeds.

I. Conventional Optoelectronic Devices

Figure 1:
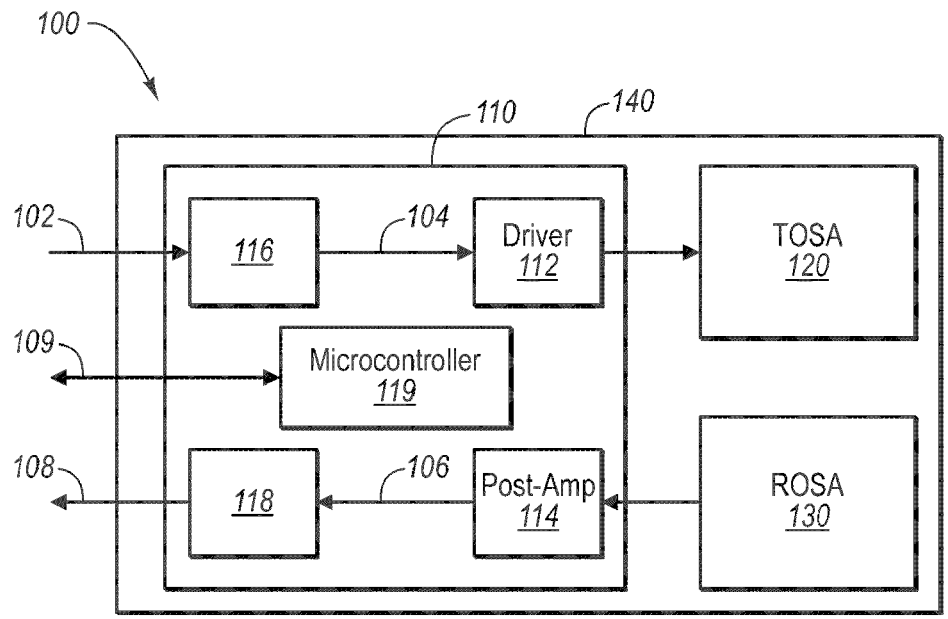
FIG. 1 illustrates a conventional optoelectronic device.

FIG. 1 illustrates some of the shortcomings of an optoelectronic device 100 commonly used in the prior art for optical communication. The device 100 of FIG. 1 is shown in simplified block diagram form and may correspond to a transceiver or transponder. As used herein, a "transceiver" is an optoelectronic device that converts one or more received serial electrical signals to a corresponding number of serial optical signals and/or that converts one or more received serial optical signals to a corresponding number of serial electrical signals. In contrast, a "transponder" converts two or more received parallel electrical signals to a fewer number of serial optical signals and/or converts one or more received serial optical signals to a greater number of parallel electrical signals.

Whether implemented as a transceiver, transponder, or other device, the optoelectronic device 100 includes a substrate or PCB 110 upon which a plurality of active and/or passive circuitry components, such as a laser driver 112 and post amplifier 114, are connected or mounted for processing electrical data signals. The device 100 additionally includes a TOSA 120 for emitting optical signals onto a fiber optic (or other optical) network and a ROSA 130 for receiving optical signals from the fiber optic network. Although not illustrated, the TOSA 120 includes an optical transmitter such as a laser and the ROSA 130 includes an optical receiver such as a photodiode. The TOSA 120 and/or ROSA 130 can be mounted on the PCB 110 or connected to the PCB 110 through flex circuits, leads, and the like.

If the device 100 is implemented as a transceiver, it may include a transmit clock and data recovery circuit ("CDR") 116 for equalizing and retiming an outbound electrical data signal 102 and/or receive CDR for equalizing and retiming an inbound electrical data signal 106. In this embodiment, the transceiver 100 can receive a serial data-carrying electrical signal 102 from a host (not illustrated), which can be any computing system capable of communication with the device 100, for transmission as a serial data-carrying optical signal. The electrical signal is first provided to the transmit CDR 116 where the CDR 116 equalizes and retimes the electrical data signal using a reference clock from the host or using the electrical data signal itself. The equalized and retimed electrical data signal 104 is provided to the driver 112 which drives the TOSA 120 to emit an optical signal representative of the electrical data signal 102. In addition, the transceiver 100 can receive a serial data-carrying optical signal using the ROSA 130. The ROSA 130 transforms a received optical signal into a serial electrical signal 106 which can be amplified by the post-amplifier 114 prior to being provided to the host.

If the device 100 is implemented as a transponder, it may alternately or additionally include a transmit serializer/deserializer ("SERDES") 116 for serializing two or more parallel data signals and/or a receive SERDES 118 for deserializing one or more serial data signals. In this embodiment, the transmit SERDES 116 receives two or more parallel data signals 102 from the host at a first (slow) signal rate and provides as output one or more serial data signals 104 at a second (fast) signal rate. The serial data signal 104 is provided to the laser driver 112 which drives the TOSA 120 to emit an optical signal representative of the serial data signal 104. Additionally, the transponder 100 can receive an optical signal using the ROSA 130, which transforms the received optical signal into a serial electrical signal 106. The receive SERDES 118 deserializes the serial electrical signal 106 into two or more parallel data signals 108 which are provided to the host.

One skilled in the art will appreciate that the transmit and receive SERDES 116, 118 can be single channel (e.g., for serializing a plurality of parallel signals into a single serial signal or for deserializing a single serial signal into a plurality of parallel signals) or multi-channel (e.g., for serializing a plurality of parallel signals into two or more serial signals or for deserializing two or more serial signals into a greater number of parallel signals) SERDES and that a corresponding number of components can be included in the transponder 100 when the SERDES 116, 118 are multi-channel SERDES. For instance, if the SERDES 116 serializes M parallel data signals into N serial data signals (where M is greater than N), N laser drivers and N TOSAs can be provided for handling the N serial signals.

Further, the SERDES 116, 118 may comply with certain interface standards. For instance, the SERDES 116, 118 may be compliant with the SFI-4.1 or SFI-5.1 interface standards, which specify conversion of 16 parallel electrical data lanes and a $17^{th}$ deskew lane (each at ~622 MHz or ~2.5 GHz, respectively) to a single serial data lane (at ~10 GHz or ~40 GHz, respectively) and vice versa. Alternately, the SERDES 116, 118 may comply with the SFI-5.2 interface standard, which specifies conversion of 4 electrical data lanes and a $5^{th}$ deskew lane (each at about 10 GHz) to a single serial data lane (at ~40 GHz), and vice versa. Other suitable interface standards may exist according to a particular embodiment and the invention should not be limited to the interface standards explicitly stated.

Returning to FIG. 1 and referring to optoelectronic devices generally, whether implemented as transceivers or transponders, some conventional optoelectronic devices 100 additionally include a microcontroller 119 which can be used for, among other things, optimizing the performance of the device 100. For example, the microcontroller 119 controls one or more of: the temperature of the optical transmitter within the TOSA 120, the optical transmitter bias current, the optical transmitter modulation amplitude, and settings on the transmit CDR/SERDES 116, receive CDR/SERDES 118, driver 112, post-amplifier 114, and the like. Additionally, the microcontroller 119 can communicate with the host over an interface 109, such as $I^2C$, SPI, MDIO, 1-wire, and the like, in order to receive control signals and/or to transmit data/alarms.

The optoelectronic device 100 may include additional components, such as an optical fiber receptacle, latching mechanisms, laser bias circuitry, TEC control circuitry, and the like or any combination thereof. These components and their disposition and function within a conventional device 100 are well known in the art and will not be described in further detail to avoid unnecessarily obscuring the invention.

The components of the device 100 can be protected by a covering or enclosure 140 such as a shell or housing configured to comply with a standardized form factor such as XENPAK, SFP, XFP, MSA300, MSA200, and the like. Alternately or additionally, the device 100 may comply with certain telecommunications standards, such as SONET/SDH, and the like. It is understood that compliance with standardized form factors and/or telecommunication standards may limit the size, and/or the power budget, for the device 100. Consequently, a conventional device 100 typically lacks the real estate and/or power budget to include components in addition to those already mentioned.

II. Optoelectronic Devices Having An Intelligent Transmitter Module

Turning to FIGS. 2-12, various optoelectronic devices are illustrated that overcome these and other limitations of the prior art by using an intelligent transmitter module, rather than a conventional TOSA, for the transmission of optical signals. As previously mentioned and as described in greater detail below, embodiments of an ITM can include an optical transmitter, a CDR and driver, and a microcontroller and/or linear amplifier. By integrating the electronic components (e.g., CDR, driver, microcontroller, linear amplifier) into the same package as the optical transmitter, numerous advantages are obtained. For purposes of the present discussion, a primary advantage is a net reduction in required PCB real estate and power dissipation relative to a conventional optoelectronic device. This advantage is obtained because (1) the CDR, driver, and microcontroller and/or linear amplifier are not on the PCB, rather they are integrated with the optical transmitter, and (2) the ITM uses less net power than the CDR, driver, microcontroller, linear amplifier and TOSA of a conventional device. Note that although an ITM may be larger than a conventional TOSA, requiring reduction in the size of a PCB or other components to accommodate the ITM, the amount of real estate made available on the PCB exceeds the amount of real estate eliminated from the PCB.

Each of the optoelectronic devices illustrated in FIGS. 2-12 includes a PCB, an ITM, and a ROSA. Each of the optoelectronic devices may additionally include one or more SERDES (transmit and/or receive) and/or a receive CDR, depending on the particular implementation of the optoelectronic device. Further, the optoelectronic devices illustrated in FIGS. 2-12 can be bidirectional optoelectronic devices capable of transmitting and receiving optical signals. Note, however, that the principles of the invention can also be implemented in unidirectional optoelectronic devices capable of transmitting optical signals but not receiving optical signals, or vice versa.

Figure 2:
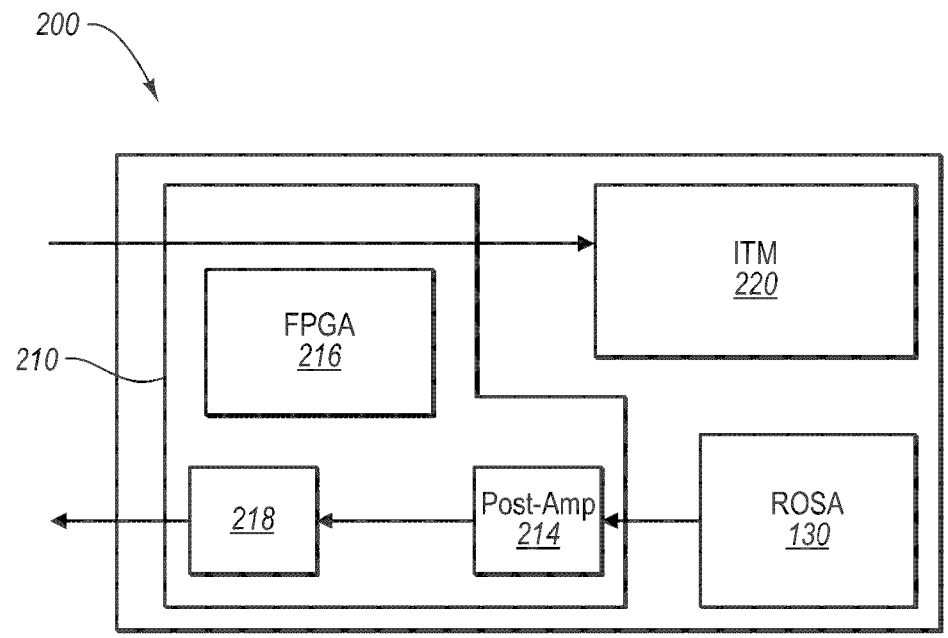
FIG. 2 illustrates an optoelectronic device with an ITM and an on-board FPGA.

With particular attention to FIG. 2, one embodiment of an optoelectronic device 200 is illustrated having available space for an electronic component not provided in conventional optoelectronic devices. The device 200 includes a PCB 210, ITM 220 and ROSA 230. A post amplifier 214 can be provided on the PCB 210 to amplify an inbound electrical signal and a receive CDR (and/or SERDES) 218 can be provided to retime (and/or deserialize) the inbound electrical signal prior to providing it to a host. The optoelectronic device 200 may additionally include a field programmable gate array ("FPGA") 216 coupled to the PCB 210.

Many times, users of optoelectronic devices desire particular functionality from devices that is not provided by device manufacturers. Consequently, device users have to be satisfied with what is available on the market. Alternately, device users can request the inclusion of an application specific integrated circuit ("ASIC") and/or firmware to be used by a microcontroller in order to obtain the desired functionality. However, this alternative is usually costly and not realistic for many device users. Further, inclusion of an ASIC may not be possible due to the lack of available real estate and/or power budget in a conventional optoelectronic device.

According to the present example, however, an FPGA 216 can be provided to permit programming of the desired functionality after manufacture. The programming of the FPGA can be performed by the manufacturer and/or by the device user. The FPGA can include a central processing unit. Since the CDR, driver, and other components can be included in the ITM rather than on the PCB 210, real estate may be available on the PCB 210 for the FPGA 216. Accordingly, the device 200 can be configured to comply with, e.g., the XFP MSA, the 300 pin MSA, and the like, while additionally including an FPGA.

In one example embodiment, the FPGA 216 can be programmed to function as a digital signal processor ("DSP"). In other words, the FPGA 216 can be programmed to implement digital signal processing algorithms. In this embodiment, the FPGA can function to improve the quality of electrical data signals received from, and/or sent to, the host. One skilled in the art will appreciate that electrical data signals received from the host, and/or from the ROSA 230, will include noise resulting from transmission through electrical circuits/traces between the host, and/or the ROSA 230, and the PCB. The FPGA 216 can eliminate irregularities in the electrical data signals caused by noise, which minimizes the number of bit errors per unit time. For instance, the FPGA can sample and quantize an outbound electrical data signal (e.g., using an A2D). Quantization of the signal includes rounding the sampled values to expected or predicted values, which tends to eliminate noise. The quantized signal can then be converted back to an analog signal (e.g., using a DAC) and provided to the ITM 220.

Figure 3:
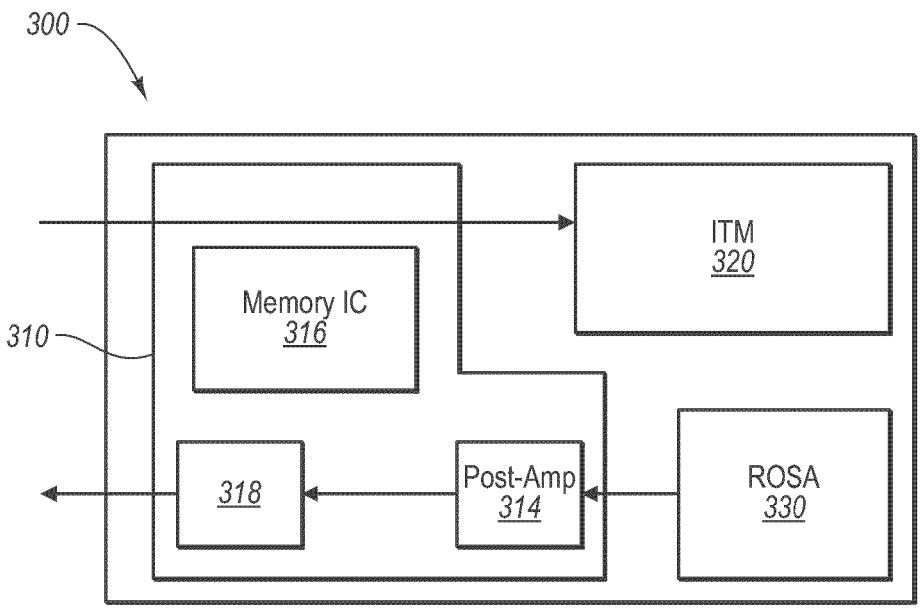
FIG. 3 illustrates an optoelectronic device with an ITM and an on-board memory chip.

Turning now to FIG. 3, another embodiment of an optoelectronic device 300 is illustrated having available space for an electronic component not provided in a conventional optoelectronic device. The device 300 can include a PCB 310, ITM 320, ROSA 330, post amplifier 314, and receive CDR (and/or SERDES) 318. The optoelectronic device 300 additionally includes a memory chip 316 coupled to the PCB 310. The memory chip 316 may be volatile and/or non volatile memory, and may comprise RAM, ROM, PROM, EPROM, EEPROM, flash memory, and the like or any combination thereof. In one embodiment, the memory 316 is used to store microcode that can be executed by a microcontroller implemented on the PCB 310 and/or inside the ITM 320. Alternately or additionally, the memory 316 can be used to store information identifying the device 300 (such as device type, capability, serial number, and the like), operational parameters/settings, and the like or any combination thereof.

Figure 4:
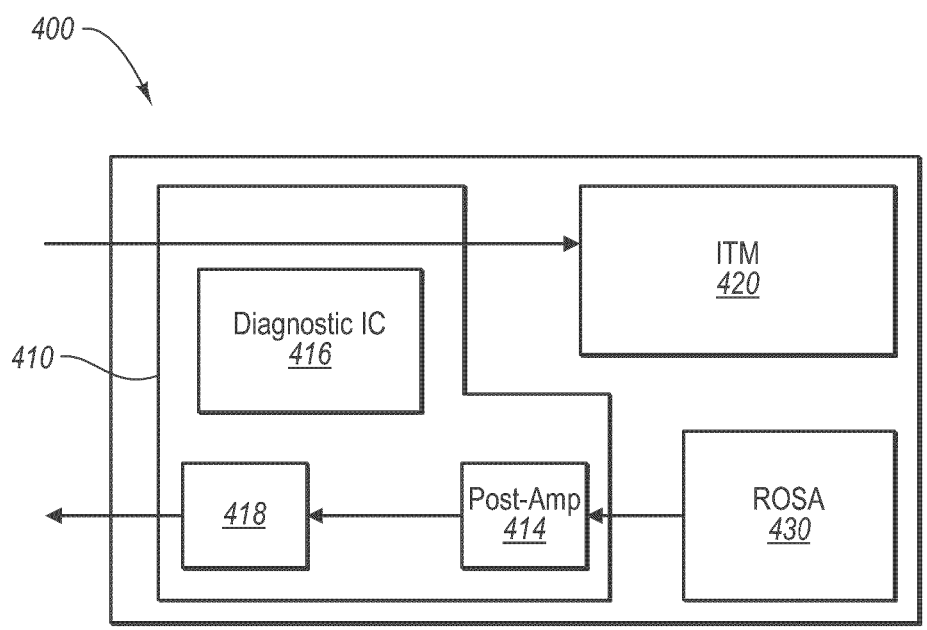
FIG. 4 illustrates an optoelectronic device with an ITM and an on-board diagnostic IC.

Turning now to FIG. 4, another embodiment of an optoelectronic device 400 is illustrated which can have an electronic component not available in conventional optoelectronic devices. The optoelectronic device 400 can include a PCB 410, ITM 420, ROSA 430, post amplifier 414, and receive CDR (and/or SERDES) 418. The device 400 can additionally include a digital diagnostic IC 416 coupled to the PCB 410. The digital diagnostic IC 416 can allow for better fault isolation and/or error detection.

The digital diagnostic IC 416 may be used to perform various tasks and to generate monitoring and operating data. In some embodiments, a digital diagnostic IC or other means for generating monitor and operating data and performing other tasks may be required for compliance with certain MSA standards. These tasks and data may include one or more of the following:

- Setup functions. These generally relate to the required adjustments made on a part-to-part basis in the factory to allow for variations in component characteristics such as transmitter threshold current.
- Identification. This refers to information identifying the optoelectronic device type, capability, serial number, and compatibility with various standards. This information may additionally include sub-component revisions and factory test data. The information may be accessed using, e.g., a serial communication standard.
- Eye safety and general fault detection. These functions are used to identify abnormal and potentially unsafe operating parameters and to report these to the host and/or perform transmitter shutdown, as appropriate.
- Temperature compensation functions. For example, compensating for known temperature variations in key transmitter characteristics such as slope efficiency.
- Monitoring functions. Monitoring various parameters related to the optoelectronic device operating characteristics and environment. Examples of parameters that may be monitored include DC supply voltage, transmitter bias current, transmitter output power, receiver power levels, supply voltage and temperature. Ideally, these parameters are monitored and reported to, or made available to, a host and thus to the user of the optoelectronic device.
- Power on time. The optoelectronic device's control circuitry may keep track of the total number of hours the optoelectronic device has been in the power on state, and report or make this time value available to a host.

Margining. "Margining" is a mechanism that allows the end user to test the optoelectronic device's performance at a known deviation from ideal operating conditions, generally by scaling the control signals used to drive the optoelectronic device's active components.

Other digital signals. A host may configure the optoelectronic device so as to make it compatible with various requirements for the polarity and output types of digital inputs and outputs. For instance, digital inputs are used for transmitter disable and rate selection functions while outputs are used to indicate transmitter fault and loss of signal conditions. The configuration values determine the polarity of one or more of the binary input and output signals. In some transceivers, these configuration values can be used to specify the scale of one or more of the digital input or output values, for instance by specifying a scaling factor to be used in conjunction with the digital input or output value.

Methods and systems for performing digital diagnostic functions are known in the art and need not be described in detail here. While digital diagnostic ICs have been provided in conventional optoelectronic devices in the past, they have not been provided in conjunction with an intelligent transmitter module 420. Due to the extra real estate on the PCB 410 and/or power budget which may result from implementing an ITM 420, the digital diagnostic IC 416 can be larger and include more functionality than a conventional digital diagnostic IC. Furthermore, in some embodiments at least some of the digital diagnostic functions can be performed by a microcontroller included within the ITM 420, as will be described in greater detail below, thereby permitting the diagnostic IC 416 to perform more diagnostic functions than a conventional diagnostic IC.

Figure 5:
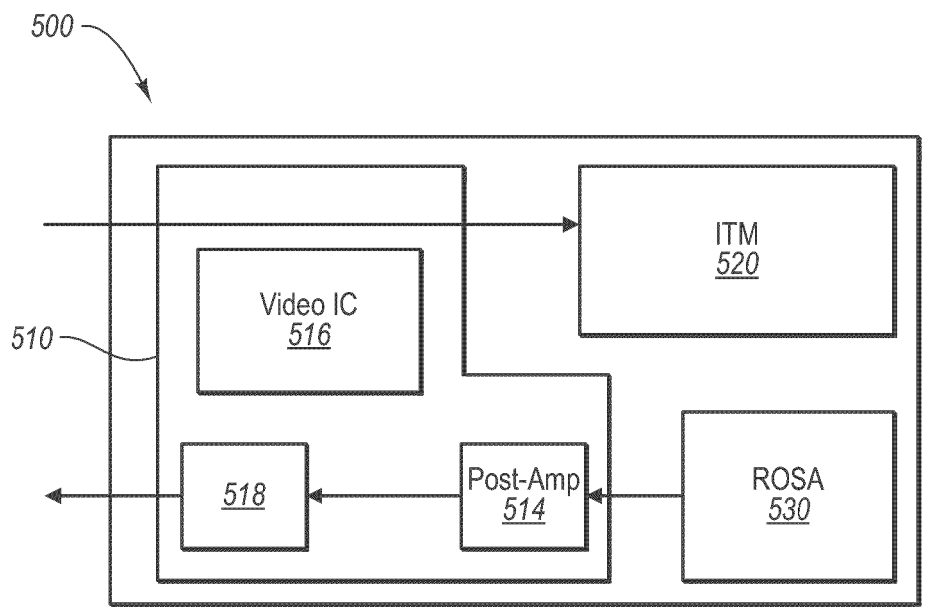
FIG. 5 illustrates an optoelectronic device with an ITM and an on-board video IC.

Turning now to FIG. 5, another embodiment of an optoelectronic device 500 is illustrated which can have an electronic component not available in conventional optoelectronic devices. The optoelectronic device 500 can include a PCB 510, ITM 520, ROSA 530, post amplifier 514, and receive CDR (and/or SERDES) 518. The device 500 can additionally include a video IC 516 coupled to the PCB 510. Inclusion of the video IC 516 may enable use of the optoelectronic device 500 to transmit and (optionally receive) video signals such as cable and satellite television signals, and the like, over optical fiber. The video IC 516 may comprise, e.g., a video decoder, a video encoder, video noise-reduction FIFOs, an LCD graphic display controller, video FIFOs, a video amplifier, a video filter, and the like or any combination thereof.

The optoelectronic device 500 may enable the transmission of video signals using optical fiber. It is appreciated that optical fiber has much lower signal loss, is much lighter and is much less expensive than materials (e.g., coaxial cable) conventionally used for video signal delivery.

Figure 6:
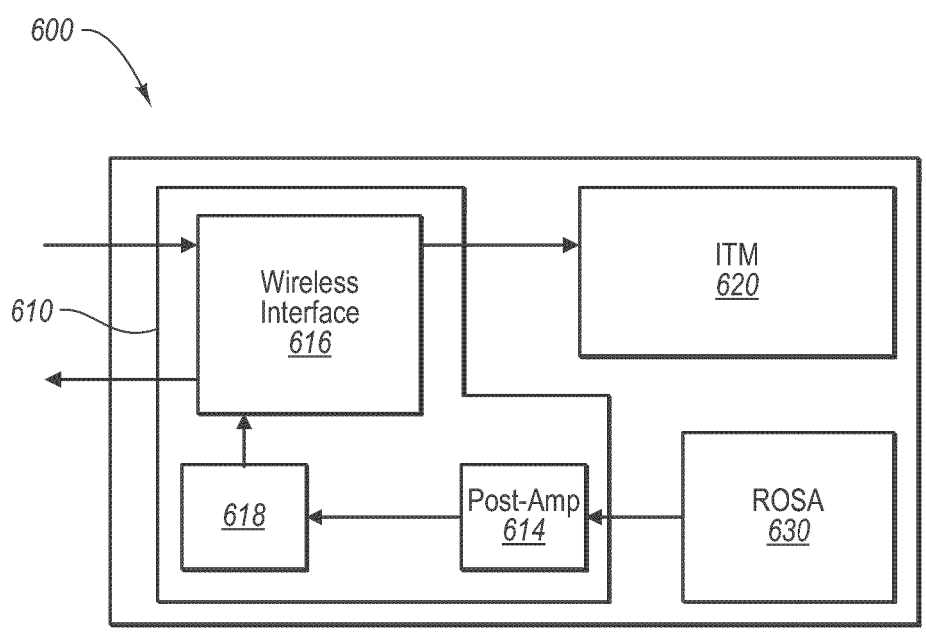
FIG. 6 illustrates an optoelectronic device with an ITM and an on-board wireless interface.

With attention now to FIG. 6, an example optoelectronic device 600 is illustrated which can have a wireless interface 616 coupled to the PCB 610 for transmitting and/or receiving wireless signals. The wireless interface 616 may include an antenna and may be configured to transmit and/or receive wireless signals to and/or from a wireless network, such as IEEE 802 related networks (e.g., WiFi, LMDS, WiMAX), cellular networks, satellite networks, terrestrial RF networks (e.g., AM, FM) and the like or any combination thereof. In one embodiment, the wireless interface 616 can comprise a wireless transceiver.

The device 600, for example, may receive wireless data signals for optical transmission over an optical fiber using the ITM 620. Or, the device 600 can additionally or alternatively receive optical data signals for transmission as wireless signals using the wireless interface 616. The device configuration 600 may enable many applications. For example, multiple devices 600 can be connected via fiber optic cables to a head end unit and distributed throughout a building or other location to provide a distributed antenna system throughout the building. Alternately or additionally, the device 600 can be implemented as a cellular or PCS transceiver to receive cellular or PCS wireless signals and transmit the wireless signals as optical signals over fiber and/or to receive optical signals and transmit them as cellular or PCS wireless signals. Alternately or additionally, the device 600 may have a hardwired connection to a host for receiving outbound electrical data signals (as in a conventional device) and the wireless transceiver 616 can be used to receive and/or transmit control signals, and the like, from and/or to the host.

Figure 7:
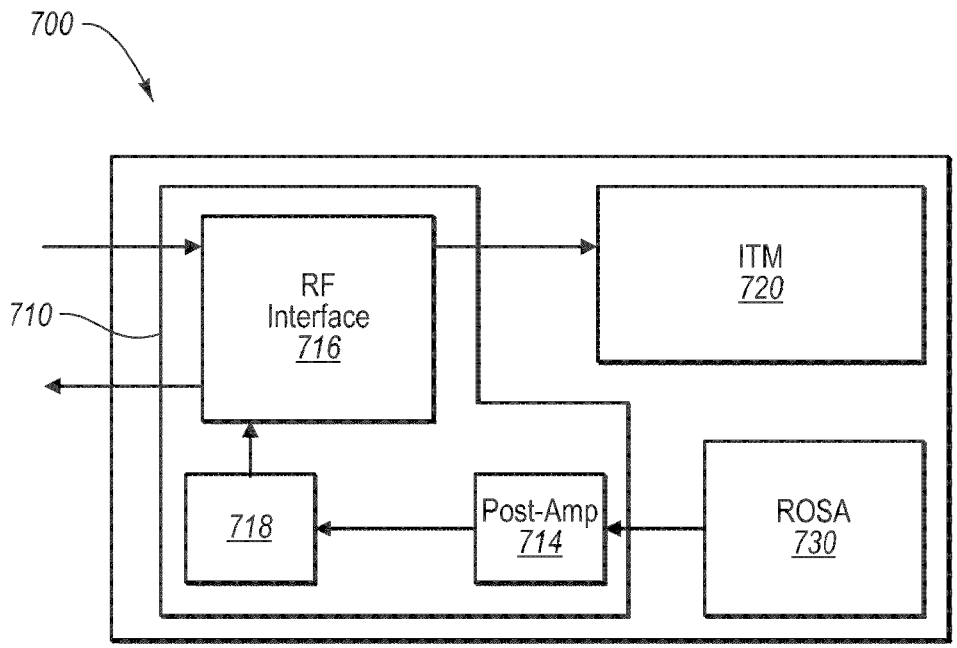
FIG. 7 illustrates an optoelectronic device with an ITM and an on-board RF interface.

Turning now to FIG. 7, an example optoelectronic device 700 is illustrated for RF on fiber applications. The optoelectronic device 700 can include an RF interface 716 coupled to the PCB 710 for receiving and/or transmitting RF signals over hardwired connections. Received RF signals can be transmitted over optical fiber as optical signals while received optical signals can be transmitted over hardwired connections as RF signals.

In the examples disclosed with respect to FIGS. 5-7, a video, wireless, or RF signal can be transmitted/received as an optical signal over an optical network. One skilled in the art will appreciate that the range, bandwidth, and performance of an optical network may be much better than in a hardwired or wireless network. Alternately or additionally, as compared to a cable/satellite TV, wireless, or hardwired RF network, there is no signal egress which ensures data security. Further, optical networks are immune to EMI and RFI interference, in contrast to a cable/satellite TV and/or hardwired RF network.

With reference now to FIGS. 8-12, various example optoelectronic devices are illustrated in which some or all of the real estate made available on a PCB by removing electronic components conventionally placed on the PCB to an ITM has been eliminated to make room in the optoelectronic device for various optical components. For instance, in FIG. 8, the extra real estate on PCB 810 has been eliminated to make room in the device 800 for a variable optical attenuator ("VOA") 840, which can be operably connected to the optical output of ITM 820. VOAs can be used to adjustably reduce the power level of an optical signal (or signals). Further, the amount of power reduction provided by a VOA may be wavelength dependent.

According to embodiments of the invention, VOA 840 can be used to provide, e.g., optical pre-emphasis. In many optical networks, Erbium-doped fiber amplifiers ("EDFAs") can be used as boosters, pre-amplifiers, and/or in-line amplifiers to amplify optical signals. However, EDFAs may display unequal amplification behavior dependent on wavelength. Similarly, attenuation in an optical fiber can be wavelength dependent. Consequently, different wavelength channels can show a different gain over an optical link such that at the end of the optical link, each wavelength may have a different power and OSNR value. This can be problematic in, e.g., wavelength division multiplexing ("WDM") systems where multiple signals, each using a different wavelength channel, share a single optical fiber.

Figure 13A:
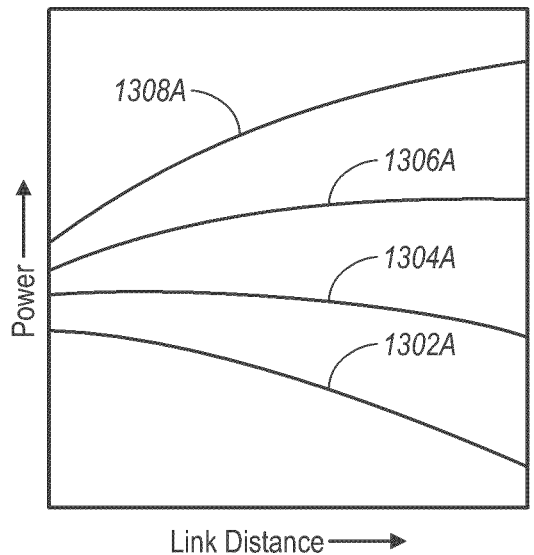
FIGS. 13A and 13B illustrate the effects on channel power of wavelength-dependent amplification/attenuation and a wavelength-dependent variable optical attenuator.

FIG. 13A illustrates an example of how the power values of different wavelength channels can vary over an optical link due to unequal amplification and/or attenuation. In this example, while the power of each wavelength channel begins at approximately the same value at the beginning of the optical link (e.g., at the output of the device 800), at the end of the optical link the powers of the wavelength channels have diverged due to the unequal amplification and/or attenuation experienced over the optical link. In particular, a first channel 1302A experiences less amplification and/or greater attenuation than a fourth channel 1308A.

Figure 8:
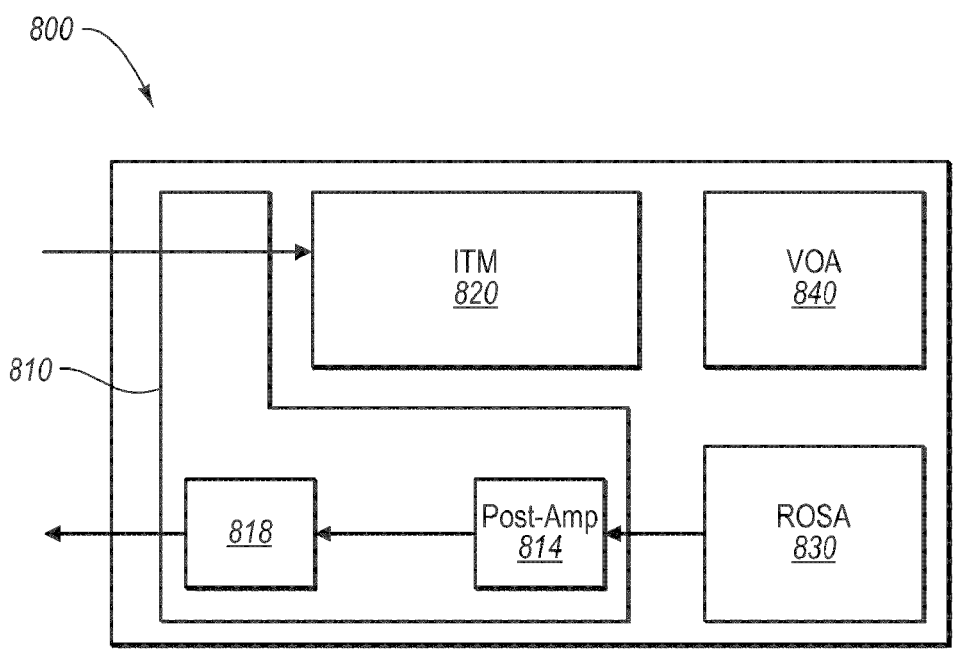
FIG. 8 illustrates an optoelectronic device with an ITM and a variable optical attenuator.
Figure 13B:
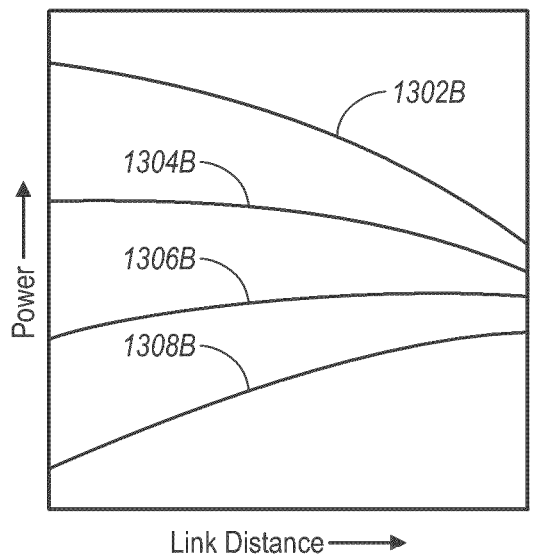

In the example of FIG. 8, however, the optical device 800 can include VOA 840 to provide optical pre-attenuation/pre-emphasis in order to adjust the output power for all wavelengths at the end of the optical link. In this case, the VOA 840 can attenuate a channel that is transmitted poorly (e.g., channel 1302A of FIG. 13A) less than a channel that is transmitted well (e.g., channel 1308A). The result is shown in FIG. 13B. As can be seen, at the beginning of the optical link (e.g., at the output of the VOA) the first channel 1302B is attenuated the least while the second, third and fourth channels 1304B, 1306B and 1308B are increasingly attenuated. After traveling the length of the optical link and experiencing unequal amplification and/or attenuation dependent on wavelength, the power of each of the wavelength channels 1302B-1308B is approximately equal.

The VOA 840 may comprise, for instance, a mechanical VOA having moving parts or a non-mechanical VOA making use of the magneto-optic effect or the thermo-optic effect of a waveguide, or some other suitable configuration. In the embodiment described above (e.g., unequal amplification and/or attenuation dependent on wavelength), a non-mechanical VOA may be preferred as the attenuation of non-mechanical VOAs can be wavelength dependent. In other embodiments where wavelength independence (e.g., wavelength flatness) is desired, however, a mechanical VOA may be preferred as an optical filter with low wavelength dependence can be selected for use in the mechanical VOA.

Figure 9:
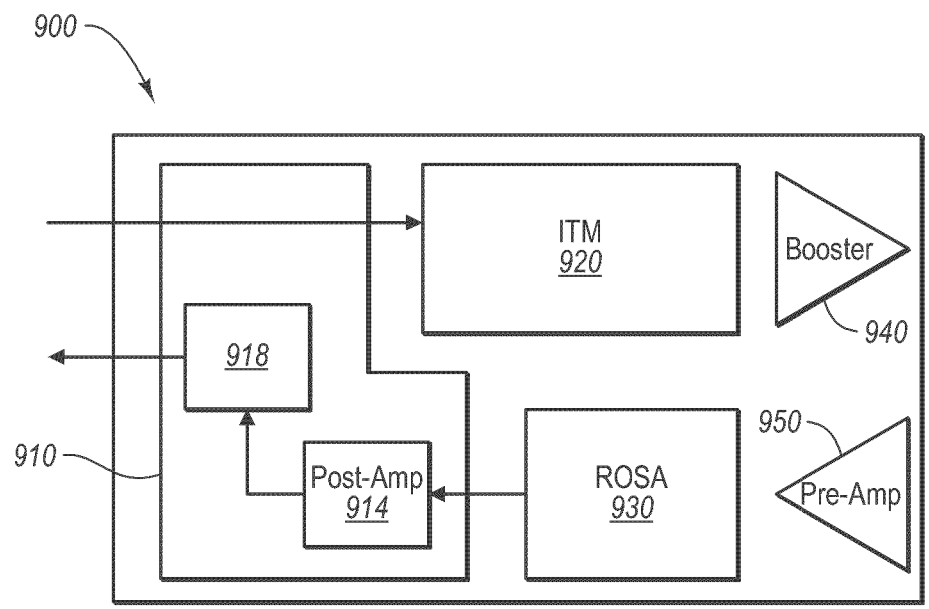
FIG. 9 illustrates an optoelectronic device with an ITM, an optical booster, and an optical pre-amplifier.

In FIG. 9, some or all of the extra real estate made available on a PCB 910 by removing electronic components from the PCB 910 to an ITM 920 is eliminated to make room for one or more optical boosters and/or preamplifiers, such as semiconductor optical amplifiers ("SOAs"), which can be operably coupled to the optical output and input of the ITM 920 and ROSA 930, respectively. In the embodiment 900 of FIG. 9, for instance, a transmit SOA 940 can be provided as a booster to increase the output power of the optical signal emitted by the ITM 920, while a receive SOA 950 can be provided as a preamplifier to increase the received power of the optical signal received by the ROSA 930. While both a transmit SOA 940 and receive SOA 950 are illustrated in FIG. 9, embodiments of the invention additionally contemplate a single SOA implemented in either the transmit or receive directions.

SOAs can use a semiconductor to provide the gain medium and can have a similar structure to Fabry-Perot laser diodes. In contrast to a laser diode, however, an antireflection coating can be used to reduce endface reflection and prevent the SOA from lasing. SOAs are electrically pumped and when an optical signal passes through an SOA, stimulated emission can cause an increase in signal photons, thereby amplifying the optical signal. SOAs can be much smaller than EDFAs (which are also used to provide optical amplification) and can be integrated with other semiconductor devices. Accordingly, while the SOA 940 is shown as a distinct component from the ITM 920, in another embodiment the SOA 940 can be integrated with semiconductor devices within the ITM 920, such as the optical transmitter. The amplification provided by the one or more SOAs in the embodiment of FIG. 9 can extend the optical reach of the device 900. Further, the use of optoelectronic devices 900 having one or more SOAs 940, 950 can reduce the potential cost and/or complexity of an optical network by eliminating and/or reducing the need for EDFAs.

Figure 10:
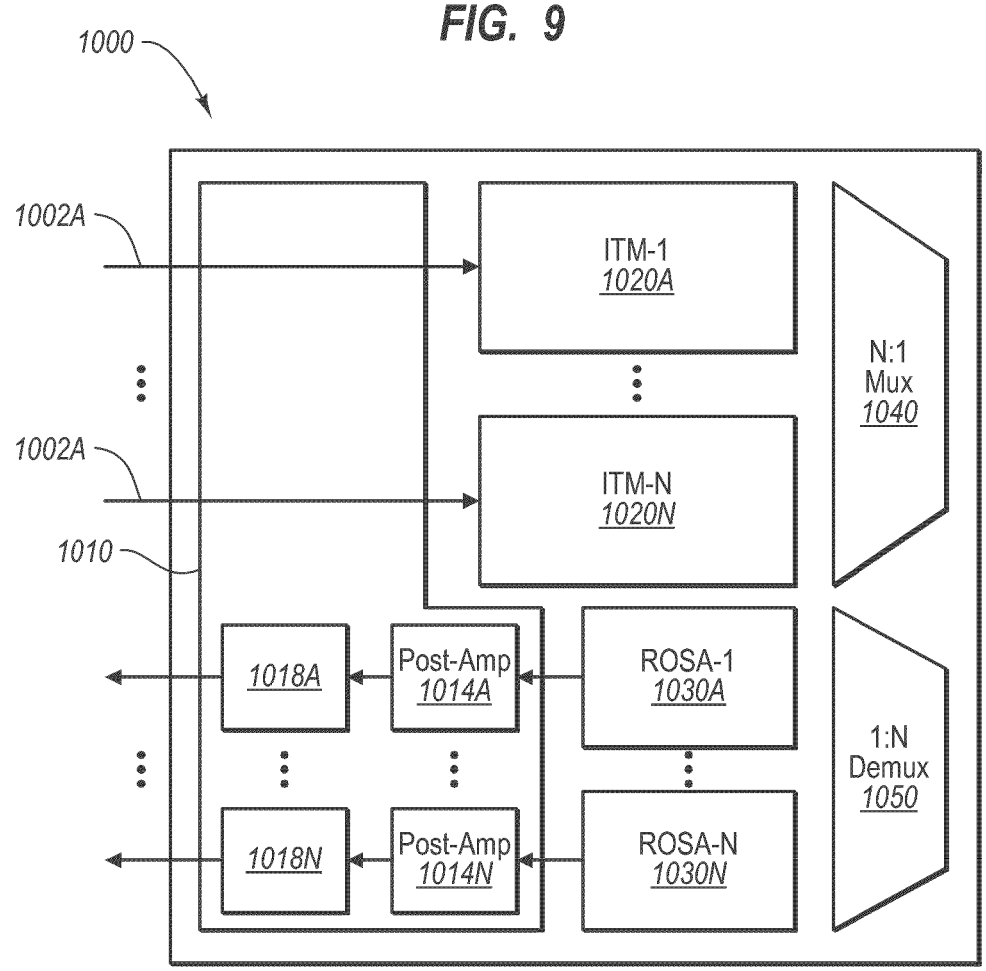
FIG. 10 illustrates a multi-channel optoelectronic device with multiple ITMs, an optical multiplexer and an optical demultiplexer.

FIG. 10 illustrates a multi-channel optoelectronic device 1000 in which the real estate savings achieved by implementing a plurality of ITMs can be used for the inclusion of an optical multiplexer ("MUX") 1040 and/or an optical demultiplexer ("DEMUX") 1050 operably coupled to the optical output and input of the ITMs 1020 and ROSAs 1030, respectively. The device 1000 can include a plurality of ITMs 1020A up to 1020N (e.g., "ITMs 1020") for emitting a plurality of optical signals, and a plurality of ROSAs 1030A up to 1030N (e.g., "ROSAs 1030") for receiving a plurality of optical signals. While illustrated with an equal number of ITMs and ROSAs, the bidirectional optoelectronic device 1000 may include an unequal number of ITMs and ROSAs for use in, e.g., systems where transmit and receive traffic is unbalanced.

As shown, the device 1000 is configured to receive up to N data carrying electrical signals 1002A up to 1002N. After being emitted as N transmit optical signals by the ITMs 1020A through 1020N, the optical MUX 1040 can multiplex the N outbound optical signals into a multiplexed transmit optical signal that can be transmitted over a single physical link. The optical DEMUX 1050 performs the inverse of the MUX 1040, receiving a multiplexed receive optical signal that can be demultiplexed into N receive optical signals. The N receive optical signals can be converted to N electrical signals by the ROSAs 1030A through 1030N and processed further by electrical components on the PCB 1010.

Each of the ITMs 1020A through 1020N can require less space than required for a conventional TOSA and corresponding CDR, driver, and/or microcontroller, and/or linear amplifier. Accordingly, the size of a multi-channel optoelectronic device 1000 having a plurality of ITMs and an optical MUX 1040 and/or DEMUX 1050 can be smaller than a conventional multi-channel optoelectronic device having a plurality of TOSAs and corresponding CDRs, drivers, and/or microcontrollers, and/or linear amplifiers, and an optical MUX and/or DEMUX. This can enable a relatively smaller form factor, resulting in greater port density, for optoelectronic devices 1000 as compared to their conventional counterparts.

Figure 11:
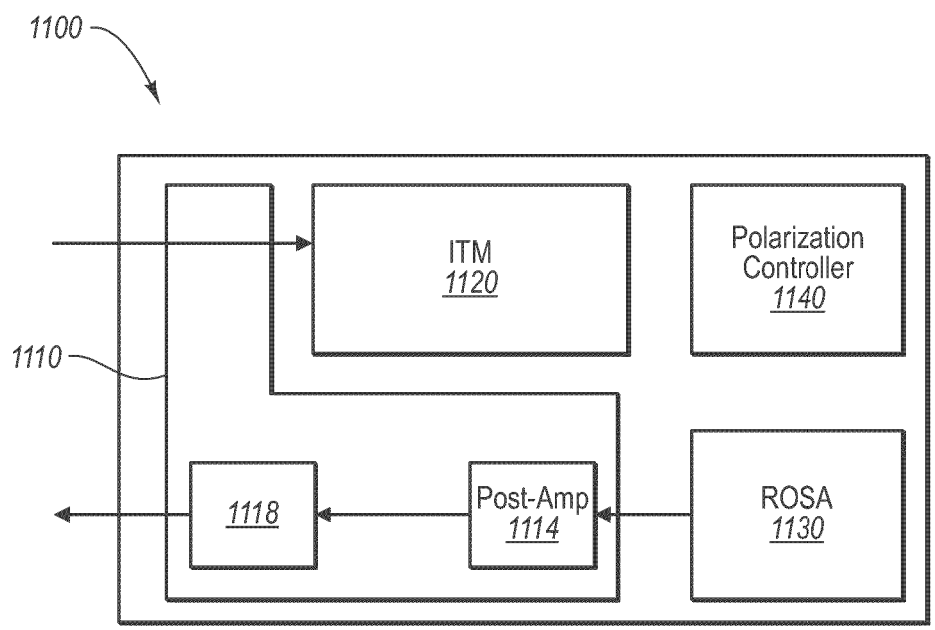
FIG. 11 illustrates an optoelectronic device with an ITM and a polarization controller.

In FIG. 11, some or all of the extra real estate made available on a PCB 1110 by removing electronic components from the PCB 1110 to an ITM 1120 can be eliminated to make room for a polarization controller 1140, which may be operably connected to the optical output of the ITM 1120. Generally speaking, a polarization controller controls the polarization of optical signals emitted by the ITM 1120. For instance, the polarization controller 1140 can be used for polarization mode dispersion ("PMD") compensation. PMD is a form of modal dispersion where two orthogonally polarized parts or polarization modes of an optical signal travel through an optical fiber at different speeds, leading to a temporal broadening of the signal. PMD results from random imperfections in the radial symmetry of the optical fiber, which may arise during the production process and/or due to environmental factors such as transverse stress, bending, twisting, aging, etc.

PMD compensation can be performed by splitting the optical output of the ITM 1120 into two principal polarizations using the polarization controller 1140 and applying a differential delay to bring them back into synch. Due to the fact that PMD effects are random and time-dependent, the polarization controller 1140 can be implemented as an active device that responds to feedback over time. In this case, a feedback loop can be provided for the polarization controller 1140. While the device 1100 has been discussed in the context of PMD compensation, the polarization controller 1140 can alternately or additionally be used for polarization scrambling, polarization multiplexing, as a polarization generator, and the like or any combination thereof.

Figure 12:
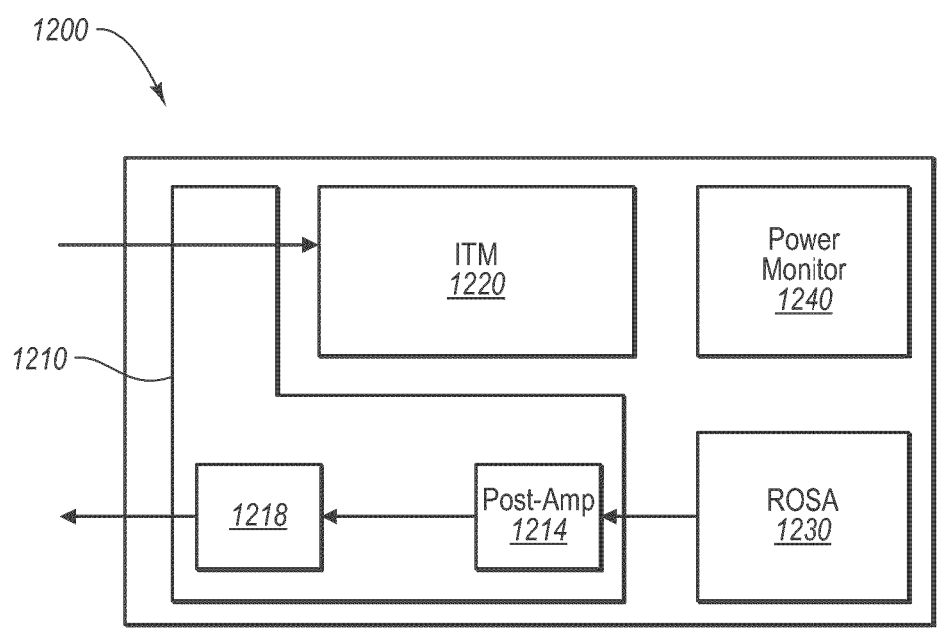
FIG. 12 illustrates an optoelectronic device with an ITM and an optical power monitor.

In FIG. 12, some or all of the extra real estate made available on a PCB 1210 by removing electronic components from the PCB 1210 to an ITM 1220 can be eliminated to make room for an optical power monitoring device 1240, which can be operably connected to the optical output of the ITM 1220. Many systems in which optoelectronic devices are implemented can require accurate measurement of the optical power emitted by an optical transmitter to optimize system performance. For instance, optical power monitoring can be used to ensure a constant output from an optical transmitter whose output may vary with temperature and/or age. While the device 1200 discloses an optical power monitoring device 1240 external to the ITM 1220, the optical power monitoring device 1240 can also be placed inside the ITM 1220 with a corresponding increase in size of the ITM 1220.

According to embodiments of the invention, the optical power monitoring device 1240 may include a photodetector. Where the optical transmitter used inside the ITM 1220 is an edge emitter, the transmission signal is emitted from the front of the emitter towards an optical fiber and another signal can be emitted from the back of the emitter. The optical power of the light signal emitted from the rear of the emitter is proportional to the optical power of the transmission signal emitted from the front of the emitter. Consequently, the optical power monitoring device 1240 can be placed inside the ITM 1220 to the rear of the emitter to monitor optical power without interfering with the transmission signal. Numerous other optical power monitoring device 1240 configurations can be implemented in embodiments of the invention and the invention should not be limited to the specific configuration described herein.

One skilled in the art will appreciate, with the benefit of the present disclosure, that the example embodiments disclosed in FIGS. 2-12 are not mutually exclusive and can be combined in a variety of ways. Further, the disclosed embodiments are provided by way of example only, and not by way of limiting the scope of the claimed invention.

In any event, due to the space and power budget savings obtained by using an ITM, rather than a TOSA and corresponding electronic components on a PCB, in an optoelectronic device, one or more of the above-described electronic and optical components can be included in an optoelectronic device that conforms to, e.g., the XFP form factor MSA, the 300-pin MSA, and the like. To better understand how the space and power budget savings can be obtained, reference will now be made to FIGS. 14A-18, which describe intelligent transmitter modules and components thereof according to embodiments of the invention.

III. Intelligent Transmitter Module

Figure 14A:
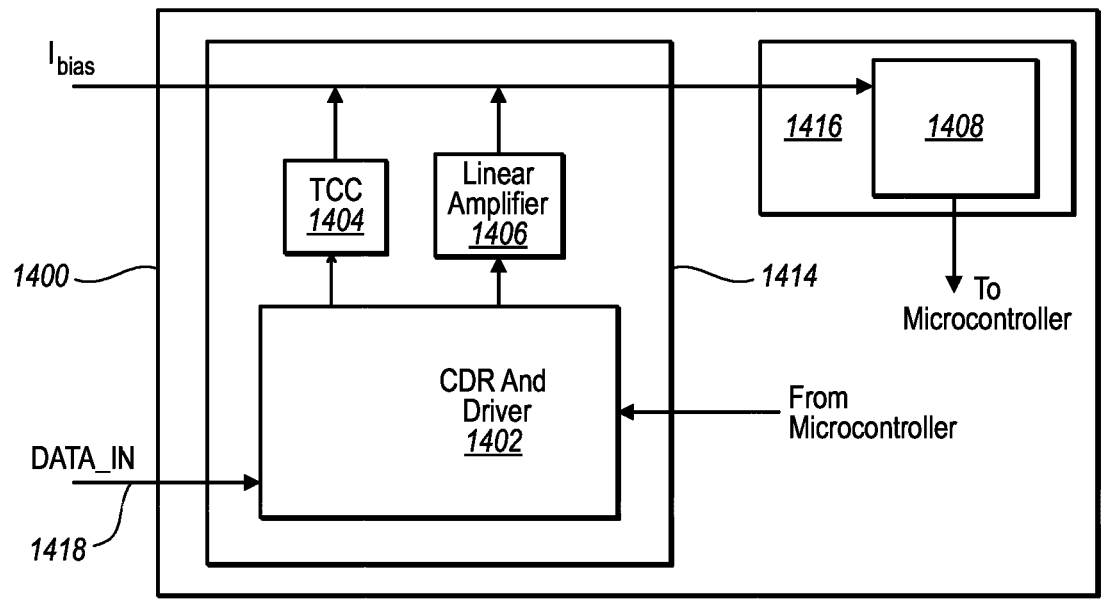
FIGS. 14A and 14B illustrate embodiments of an intelligent transmitter module.
Figure 14B:
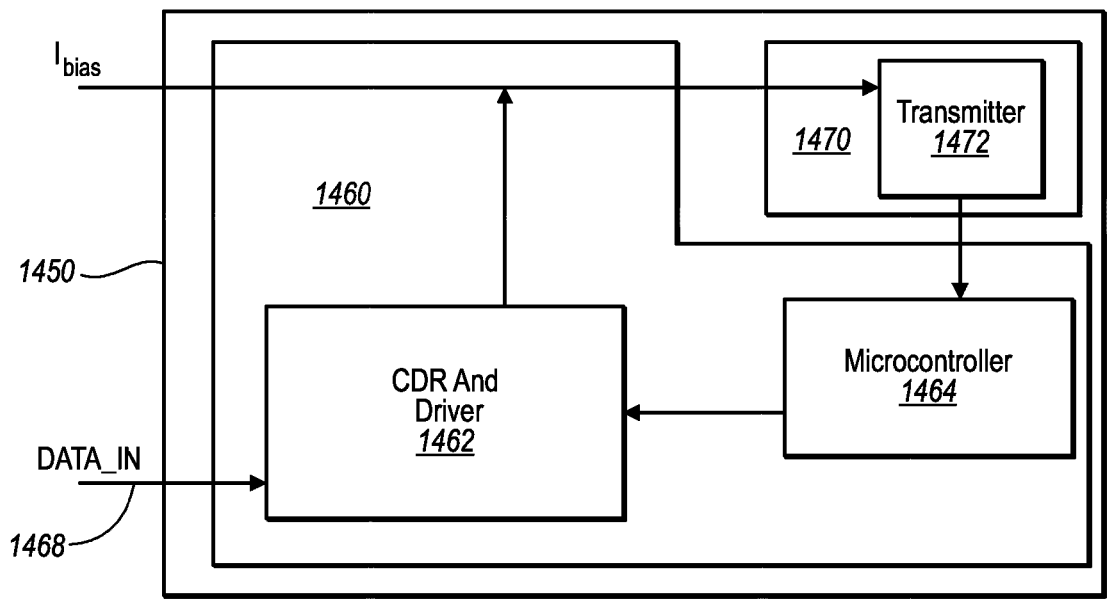

FIGS. 14A and 14B depict two embodiments of an intelligent transmitter module in simplified block form that may be implemented in embodiments of the invention. In FIG. 14A, ITM 1400 includes a first substrate 1414 and a second substrate 1416. Various electronic components typically bonded to or manufactured on the PCB of a conventional optoelectronic device are bonded to or manufactured on the first substrate 1414, including a CDR and driver IC 1402, a thermal chirp compensation ("TCC") circuit 1404, and a linear amplifier 1406. The second substrate 1416 includes a laser with managed chirp 1408, which is one type of optical transmitter that can be implemented in embodiments of the invention. Embodiments of a laser with managed chirp are marketed by the Finisar Corporation as Chirp Managed Laser CML™ transmitters.

In FIG. 14B, ITM 1450 also includes a first substrate 1460 and a second substrate 1470. The first substrate 1460 includes various electronic components, including a CDR and driver IC 1462 and a microcontroller 1464. The second substrate 1470 includes an optical transmitter 1472. It is appreciated that the embodiments of FIGS. 14A and 14B are illustrative only and that different and/or additional electronic and/or optical components (other than those illustrated) can be included in an ITM. For instance, the ITM 1400 of FIG. 14A may have an optical transmitter other than a laser with managed chirp 1408, can additionally include a microcontroller bonded to the first substrate 1414, and/or can additionally include other components such as an optical power monitoring device, an SOA, and the like. Alternately or additionally, the ITM 1450 of FIG. 14B may include a linear amplifier, TCC circuit, optical power monitoring device, SOA, and the like, and/or the transmitter 1472 may comprise a laser with managed chirp.

In operation, the ITM 1400 of FIG. 14A receives a differential electrical signal 1418 for transmission as a data-carrying optical signal. At the CDR and driver IC 1402, the electrical signal is equalized and retimed by a CDR stage. Alternately or additionally, the CDR stage can recover a clock from the electrical signal for use in a transponder, for instance. The CDR stage can equalize and retime the signal 1418 using a clock signal from a host, using the data signal itself, or any combination thereof. Alternately or additionally, the CDR stage can be bypassed.

The output of the CDR stage is provided within the CDR and driver 1402 to a driver stage configured to generate a modulation signal. In one embodiment, the driver stage includes a VCSEL driver capable of driving 50 ohm impedance loads. The driver stage of the CDR and driver 1402 may be further configured to perform wave-form shaping of the retimed electrical data signal, including pre-emphasis, de-emphasis, jitter pre-compensation, asymmetric rise fall time, asymmetric boost, cross-point adjust, modulation amplitude adjust, polarity control, laser DC bias control, and the like or any combination thereof.

For long-wave applications and in other embodiments of the invention, the modulation signal can be amplified by linear amplifier 1406 prior to being provided to the laser 1408, which emits an optical signal representative of the electrical signal 1418. As will be discussed in greater detail below, the operation of the laser 1408 depends on managing the chirp of a distributed feedback ("DFB") or other laser. For this reason, the TCC circuit 1404 can be included in the ITM 1400 for providing thermal chirp compensation. As shown, the ITM 1400 may interact with an external microcontroller configured to perform digital diagnostic functions and/or to optimize performance of the ITM 1400.

The operation of the ITM 1450 of FIG. 14B is similar to that of ITM 1400. The ITM 1450, however, may be configured for short-wave applications (e.g., 850 nm) as shown and can include a vertical cavity surface emitting laser (VCSEL) or other short-wave transmitter 1472. In this case, the output of the CDR and driver IC 1462 can be used to directly drive transmitter 1472 to emit an optical signal representative of the electrical signal 1468. Additionally, the ITM 1450 can include an internal microcontroller IC 1464 configured to perform digital diagnostic functions and/or to optimize the performance of the ITM 1450. For instance, the microcontroller may monitor transmitter temperature, transmitter optical output power, and the like or any combination thereof. Further, the microcontroller 1464 may adjust settings on the CDR and driver IC 1462 and/or transmitter 1472. In some embodiments of the invention, the microcontroller 1464 (or an externally provided microcontroller in the embodiment of FIG. 14A) may facilitate wavelength locking, filter tuning, electrical cross point adjust, thermal chirp management control, and the like or any combination thereof.

While the embodiments of FIGS. 14A and 14B have been described as implementing a laser with managed chirp or a short-wave VCSEL, other transmitters having any suitable configuration can alternately be implemented. For instance, the transmitter used in the embodiments of FIG. 14A or 14B may alternately or additionally comprise a laser integrated modulator ("LIM"), a DFB laser, a cooled or uncooled externally modulated laser ("EML"), an EML with a wavelocker, a cooled or uncooled directly modulated laser ("DML"), a DML with a wavelocker, and the like or any combination thereof. Further, the transmitters 1408, 1472 can be configured to operate at data rates of 10 gigabits per second and more.

According to embodiments of the invention, the ITMs 1400, 1450 can be configured to support multiple communication protocols, including two or more of SONET, SDH, Ethernet, Fiber Channel, and others. In order to support multiple protocols, the ITMs 1400, 1450 can include the CDR stage of the IC 1402, 1462 for equalization and retiming of the electrical data signal 1418, 1468 and/or clock recovery. As already mentioned, the CDR stage can be bypassed where clock recovery and/or equalization and retiming of the electrical data signal is not required. For instance, a host can communicate with a microcontroller external or internal to the ITMs 1400, 1450 over a suitable interface (e.g., SPI, MDI, I²C, etc.) to identify whether equalization and retiming is necessary. Accordingly, the microcontroller can then control the CDR stage of the CDR and driver IC 1402, 1452 to equalize and retime the electrical data signal 1418, 1468 or not.

In some embodiments of the invention, electronic components (e.g., linear amplifier IC, CDR and driver IC, and the like) within the ITM 1400 (and/or 1450) can be flip chip bonded to the first substrate 1414. Flip chip bonding can reduce the length of the interconnects between the ICs 1402, 1406 and the substrate 1414 to which the ICs are attached, thereby reducing signal degradation due to cross talk and parasitic capacitance and reducing EMI, etc. Notwithstanding the advantages of flip chip bonding, other bonding techniques may alternately or additionally be used to operably connect the ICs 1402, 1406 to the substrate 1414, including wire bonding, through-hole construction, and surface mount technology.

The substrate 1414 may comprise, for instance, multilayer high frequency laminate or silicon wafer, and the like or any combination thereof. Alternately or additionally, the substrate 1414 may comprise hybrid ceramic or thin film. In embodiments in which a laminate is implemented, the substrate can include a first layer for a transmission line, a second layer for ground, a third layer for a power plane, and the like or any combination thereof. The substrate 1414 may include blind and/or buried vias for electrically connecting components (e.g., ICs 1402 and 1406, passive elements such as filters, and the like) to the substrate 1414.

In embodiments of the invention, the ITM 1400 (and/or 1450) can be hermetically sealed within a faraday cage to reduce the effects of EMI on the ITM and/or from the ITM. In this case, the number of high speed feedthroughs may be limited to as few as three: e.g., two for an incoming differential signal and one for ground. Various low speed DC feedthroughs, which may be easier and less expensive to make than high speed feedthroughs, can be provided as well, e.g., $I_{Bias}$, TEC1⁺, TEC1⁻, TEC2⁺, TEC2⁻, Vcc1 (for the CDR and driver), Vcc2 (for the linear amplifier), ground, various control lines to interface with an external microcontroller, and the like or any combination thereof.

According to embodiments of the invention, an ITM 1400 or 1450 can be operated within a transceiver, transponder, or other module. In this case, the ITM 1400 or 1450 can be operably connected to a PCB or other circuitry within the module using a flex circuit to preserve signal integrity from the PCB to the ITM. Note, however, that since the ITM includes a CDR, leads can also be used between the PCB and ITM and losses in signal integrity due to the use of leads can be recovered by the CDR.

A. Integrated CDR and Driver IC

Figure 15A:
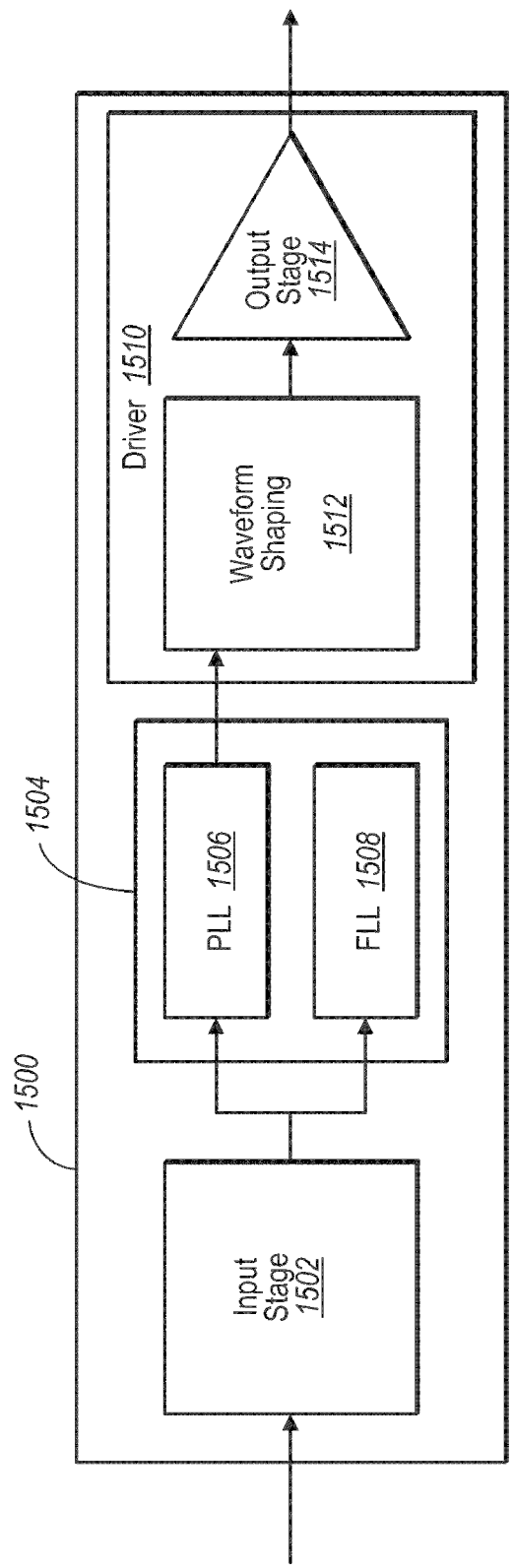
FIG. 15A illustrates an example CDR and driver IC according to one embodiment of the invention.

One example of an integrated CDR and driver that can be implemented within an ITM 1400, 1450 and/or in other environments is depicted in FIG. 15A. The integrated CDR and driver 1500 includes an input stage 1502, a CDR or equalization and retiming stage 1504, and a driver stage 1510 that can include waveform shaping 1512 and an output stage 1514. An incoming electrical data signal, which may comprise a differential signal pair, can be received at the input stage 1502 and provided to the CDR stage 1504 for equalization and retiming and/or clock and data recovery. The CDR stage 1504 can include a phase-locked loop ("PLL") 1506 and frequency-locked loop ("FLL") 1508.

Once the electrical signal has been equalized and retimed, it can be provided to the driver stage 1510 where it can be shaped and optimized for transmission as an optical signal. The driver stage 1510 can comprise a high current switching driver, such as a VCSEL modulator capable of driving 50 ohm impedance loads, although this is not required in all embodiments. Further, the driver stage 1510 may include waveform shaping features. For instance, the driver stage 1510 can be configured to perform one or more of: pre-emphasis, de-emphasis, jitter pre-compensation, asymmetric rise/fall time, asymmetric boost, and the like or any combination thereof. Finally, the equalized, retimed, and reshaped electrical data signal is provided to the output stage 1514 for output.

Figure 15B:
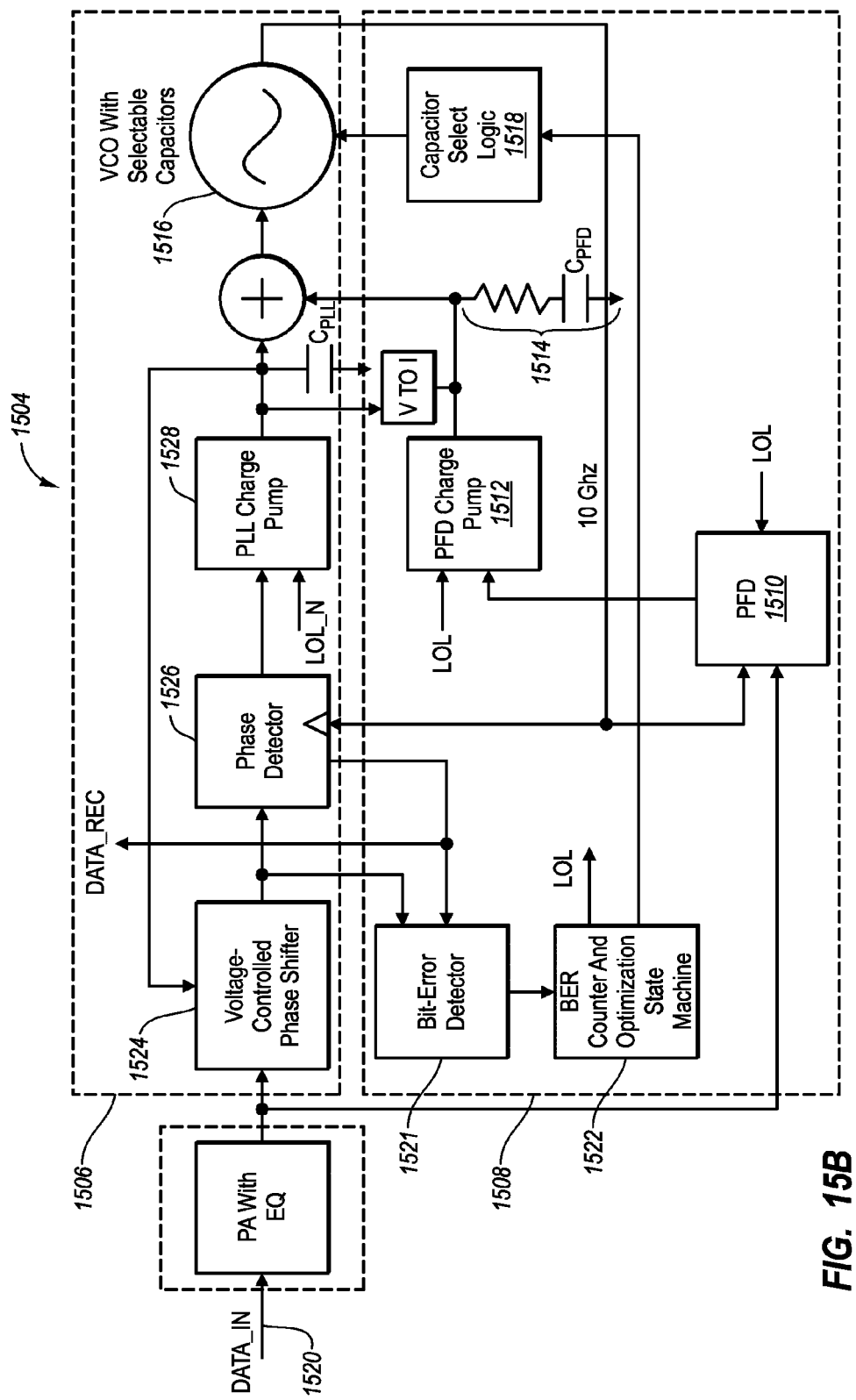
FIG. 15B illustrates one embodiment of a CDR that can be implemented in the CDR and driver IC of FIG. 15A.

Details regarding an example of the CDR stage 1504 are illustrated in FIG. 15B, which illustrates CDR 1504 with PLL 1506 and FLL 1508. The FLL 1508 can include a phase frequency detector ("PFD") 1510, a PFD charge pump 1512, a loop filter 1514, a voltage-controlled oscillator ("VCO") 1516, capacitor select logic 1518, a bit-error detector 1521, and BER counter 1522. The FLL 1508 may have a broader acquisition range than the PLL 1506 and can be used to lock the VCO frequency onto the frequency of a reference signal, which in some embodiments may include the incoming electrical data signal 1520. The PFD 1510 can monitor the reference signal frequency and the VCO frequency, generating a signal indicating a frequency-locked condition when the two frequencies are equal (or within a certain margin).

The PLL 1506 can include a voltage-controlled phase shifter 1524, a phase detector ("PD") 1526, a PLL charge pump 1528, and the VCO 1516. Once the frequency has been locked, the PLL 1506 can drive any remaining frequency error to zero and align the clock to the phase of the electrical data signal for the retiming function.

Frequency equalization can help reduce jitter generation under band-limited input signal conditions and the use of a separate PLL and FLL can reduce the likelihood of false locking. Additionally, the PLL 1506 can be a dual-loop PLL which can provide for low jitter generation and high tolerance. Further, the FLL 1508 can include BER detector 1520 and PFD 1510 with LOL detect and switch-able capacitors, the combination of which can provide for a wide pull-in range over process corner and bit rates. One skilled in the art will additionally appreciate, with the benefit of the present disclosure, that the capacitor select logic 1518 and switch-able capacitors may enable dynamic trimming of the VCO 1516 at insertion of the electrical signal, thereby eliminating the need to test and trim in the factory.

Returning to FIG. 15A, it will be appreciated by those skilled in the art that the integration of the CDR 1504 and driver stage 1510 on a single IC is not a trivial matter; various obstacles must be overcome to ensure proper functioning of the integrated component. For example, operation of a CDR is optimized in a low-noise environment. However, a driver is an inherently high-noise circuit. Consequently, a conventional CDR fabricated on the same die as a conventional driver will not function properly since the noise from the driver can be picked up by the VCO of the CDR, thereby preventing phase detection and/or frequency acquisition.

Accordingly, in some embodiments of the invention the CDR and driver can be separately grounded. Furthermore, capacitive couplings can be used to isolate the CDR from the driver.

While FIG. 15A illustrates the CDR 1504 and driver 1510 as being integrated in a single IC, in other embodiments the CDR and driver can be implemented in separate ICs. Whether implemented with or without a driver, the CDR 1504 can help preserve key microwave and/or SONET transmission performance parameters. Thus, data retiming and regeneration (provided by the CDR 1504) can be implemented to process SONET signals which typically include phase delay, rise-fall time degradation, BW degradation, and so on.

B. Linear Amplifier

Figure 16:
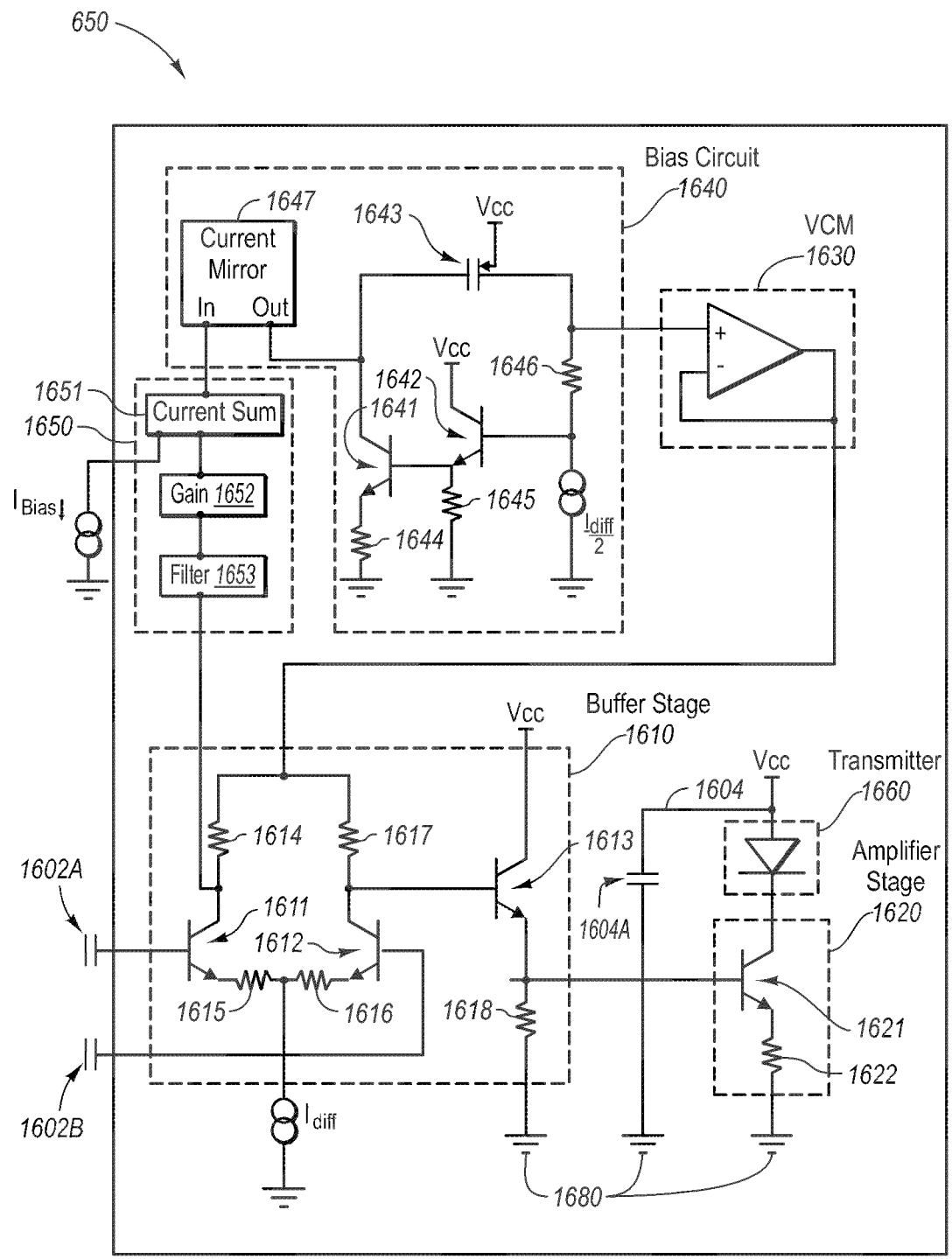
FIG. 16 is a diagram of a linear amplifier that can be implemented in an intelligent transmitter module, according to one embodiment.

Turning now to FIG. 16, one embodiment of a linear amplifier 1600 is depicted that may be implemented in embodiments of the invention. The linear amplifier 1600 may correspond to the linear amplifier 1406 of FIG. 14A and can be operated to drive the transmitter 1408 where the modulation signal provided by the integrated CDR and driver 1402 is insufficient to properly drive the transmitter and/or in other circumstances.

The linear amplifier 1600 can be configured to be operably coupled between a driver output (not shown) and an optical transmitter 1660, each of which may correspond to, respectively, the driver output of IC 1402 and optical transmitter 1408 of FIG. 14A. As shown, the linear amplifier circuit can include two input nodes 1602A and 1602B for receiving a differential signal from the driver, a buffer stage 1610, an amplifier stage 1620, a VCM 1630, a feedback loop or bias circuit 1640, and an optional thermal chirp compensation ("TCC") circuit 1650.

The input nodes 1602A, 1602B may include AC-coupling capacitors, although this is not required in all embodiments. The buffer stage 1610 can include one or more transistors 1611-1613 and one or more resistors 1614-1618. The amplifier stage 1620 can include one or more transistors 1621 and one or more resistors 1622. The bias circuit 1640 can include one or more transistors 1641-1642, one or more capacitors 1643, one or more resistors 1644-1646, and a current mirror 1647.

The transistors depicted in FIG. 16 may include bipolar transistors, although this is not required in all embodiments. For instance, the transistors of FIG. 16 may alternately or additionally include field-effect transistors without altering the theory, spirit and advantages of embodiments of the invention.

Decoupling circuit 1604 can be provided between supply node 1670 and signal ground 1680 such that signal ground 1680 does not need to be an RF ground. While illustrated as including a decoupling capacitor 1604A, one skilled in the art should appreciate that the decoupling circuit 1604 can be more complicated in order to address different ranges of frequencies of interest. Thus, the decoupling circuit 1604 may alternately or additionally include capacitors, resistors, inductors, and the like.

In operation, a differential signal can be received from the driver output stage (not shown) by the buffer stage 1610. The buffer stage 1610 can convert the differential signal to a single-ended signal and provide it to the amplifier stage 1620, sending it from the emitter terminal of buffer stage transistor 1613 to the base terminal of amplifier stage transistor 1621. The amplifier stage transistor 1621 can pull current through the transmitter 1660, the magnitude of the current pulled through the transmitter being directly proportional to the current received from the buffer stage transistor 1613. Accordingly, the single-ended signal received from the buffer stage transistor 1613 can be amplified by the amplifier stage transistor 1621 and the transmitter 1660 can then emit an optical signal representative of the amplified signal. The electrical signals can then be returned to signal ground 1680, the signal ground 1680 being separate from a header or chassis ground.

Although not required in all embodiments, the circuit 1600 can include a TCC circuit 1650, as disclosed in FIG. 16. The TCC circuit 1650 can be adapted for operation with a laser with managed chirp, embodiments of which are described herein. As shown, the TCC circuit 1650 can include a current summing circuit 1651, a gain stage 1652, and a filter 1653, and can be configured to adjust the bias current bias supplied to the optical transmitter 1660 up or down to compensate for thermal chirp and maintain operation of the transmitter 1660 at a fixed wavelength.

Briefly, chirp is the frequency modulation of an emitted optical signal resulting when a transmitter, such as a DFB laser, is directly modulated. A directly modulated DFB laser exhibits three types of chirp: (1) transient chirp, (2) adiabatic chirp, and (3) thermal chirp. Transient chirp has a short-term damped oscillatory behavior and occurs at 1-to-0 and 0-to-1 bit transitions. Transient chirp is usually undesirable, but can be controlled to manageable levels through proper biasing of the transmitter. Adiabatic chirp is proportional to optical intensity, causing 1 bits to be blue-shifted relative to 0 bits. While undesirable in many instances, adiabatic chirp can be managed, and in fact can be central to using a laser with managed chirp, as discussed below. Thermal chirp has the opposite sign of adiabatic chirp and has a delayed response to an applied current, the response increasing exponentially in time. Thermal chirp is generally undesirable.

Thermal chirp is affected by the mark density (e.g., the ratio of 1 bits to total bits) of a bit sequence. While the mark density for a random bit sequence averages to 1/2, local segments of the sequence may have a higher or lower mark density. For a directly modulated DFB laser, a high density of 1's will tend to heat the laser since the average injection current is increased, while a high density of 0's will tend to cool the laser. The change in temperature of the laser can change the refractive index of the laser, resulting in a change in laser frequency. Hence, the temperature of the laser and its optical frequency tend to wander over time in response to short term changes in the mark density of the bit sequence.

When the DFB laser is used in a laser with managed chirp, an optical spectrum reshaper ("OSR") converts the frequency wander to amplitude wander, causing the amplitude of the 1 and 0 bits to change slowly at the output of the laser with managed chirp depending on the mark density of the applied system. Additionally, frequency wander caused by thermal chirp can cause variations in the arrival time of the bits at a receiver when the emitted signal is transmitted over a dispersive fiber. Both of these consequences are generally undesirable.

However, to compensate for thermal chirp and eliminate or reduce these deleterious consequences, the TCC circuit 1650 can identify long strings of 1s or 0s and cause the bias circuit 1640 to adjust the transmit power of the transmitter 1660 up or down as needed to maintain the desired chirp.

C. Laser with Managed Chirp

Figure 17:
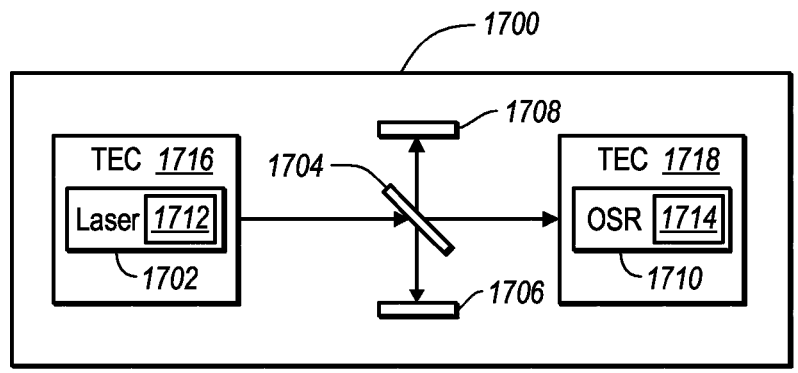
FIG. 17 illustrates one embodiment of a laser with managed chirp according to the invention.

Turning now to FIG. 17, one embodiment of a laser with managed chirp 1700 is illustrated that can be implemented in embodiments of the invention. The laser with managed chirp 1700 may correspond to the transmitter 1408 of FIG. 14A or the transmitter 1472 of FIG. 14B. The primary components of the module 1700 are an optical signal source 1702 such as a DFB laser and an optical spectrum reshaper ("OSR") 1710 or multi-cavity etalon filter. Basically, the OSR 1710 converts a frequency modulated signal of the optical signal source 1702 to an amplitude modulated signal and additionally introduces phase correlation between the bits of the signal.

The laser with managed chirp 1700 can additionally include supporting optics and various electronic components. The support optics can include a beam splitter 1704 and power and wavelength detecting photodiodes 1706 and 1706. The electronic components can include a first thermistor 1712 for monitoring the temperature of the laser 1702, a second thermistor 1714 for monitoring the temperature of the OSR 1710, a first thermoelectric cooler ("TEC") 1716 for regulating the temperature of the laser 1702, and a second TEC 1718 for regulating the temperature of the OSR 1710.

The laser 1702 can be a directly modulated DFB laser in the example shown in FIG. 17, or other suitable optical signal source. For instance, the laser 1702 can alternately be an externally modulated DFB laser, or a LIM, in which case the TEC 1718, OSR 1710, and thermistor 1714 could be omitted. Alternately, the laser 1702 may include a VCSEL with a 30 mA maximum bias current, in which case the TEC 1716 and thermistor 1712 could be omitted, and a CDR and driver IC could drive the laser 1702 without a linear amplifier, as illustrated in FIG. 14B.

A module 500 manages the chirp of a transmitter 1702 to optimize a signal produced by the transmitter. As mentioned above, when a semiconductor transmitter such as a DFB is directly modulated, three types of chirp are exhibited: transient chirp, which occurs at bit transitions and hastens pulse spreading in fibers with positive dispersion; adiabatic chirp, which makes 1 bits blue-shifted relative to 0 bits; and thermal chirp, which as the opposite sign of adiabatic chirp and increases exponentially in time. Conventional DML transmitters are biased near threshold, in which case transient chirp dominates and prevents the use of the DML in long-haul applications due to pulse spreading, which results in rapid distortion in the eye after propagation.

However, the laser 1702 can be biased high above threshold to reduce transient chirp, which can also lead to a low extinction ratio at the laser output. While transient chirp is reduced, the low extinction ratio at the laser output can be problematic for signal propagation. However, the extinction ratio can be increased using the OSR 1710. The OSR 1710 can include a filter with a transmission window configured to discriminate between blue-shifted 1 bits and red-shifted 0 bits. Consequently, the OSR 1710 can transmit 1 bits with little or no loss while attenuating 0 bits to increase the extinction ratio of the signal. In addition, the OSR 1710 can form a wavelength locker together with the two photodiodes 1706, 1708 and the beam splitter 1704. Thermal chirp can be managed as described above using a TCC circuit.

Adiabatic chirp, together with the OSR 1710, can introduce phase correlation between the bits, which can increase dispersion tolerance and reduce the information bandwidth by a factor of two. Consider a "1 0 1" bit sequence at 10 G where 1 bits have 5 GHz higher frequency than 0 bits. The phase of the carrier slips by $2\pi \times 5$ GHz$\times 100$ ps$=\pi$ during the 0 bit, making the second 1 bit $\pi$ out of phase with the first. Normally dispersion closes the eye by spreading the energy of the 1 bits into adjacent 0 bits. Here, the 1 bits interfere destructively in the middle 0 bit because of the $\pi$ phase shift, keeping the eye open after fiber propagation.

The wavelength locker can be operated by detecting a photocurrent from each of the photodiodes 1706 and 1708. The photocurrents can be provided to a microcontroller which can use a lookup table or other means to determine the wavelength of the emitted signal based on the photocurrents. A temperature measurement from the thermistor 1714 can be used by the microcontroller to determine the transmission window of the OSR 1710. The transmission window can be changed and the wavelength of the signal locked onto by changing the temperature of the OSR 1710 using the TEC 1718. Alternately or additionally, the wavelength of the emitted signal can be changed by increasing or decreasing the temperature of the transmitter 1702 using the TEC 1716.

More details regarding lasers with managed chirp are provided in U.S. patent application Ser. No. 10/289,944, filed Nov. 6, 2002, which is incorporated herein by reference in its entirety.

D. Microcontroller

Figure 18:
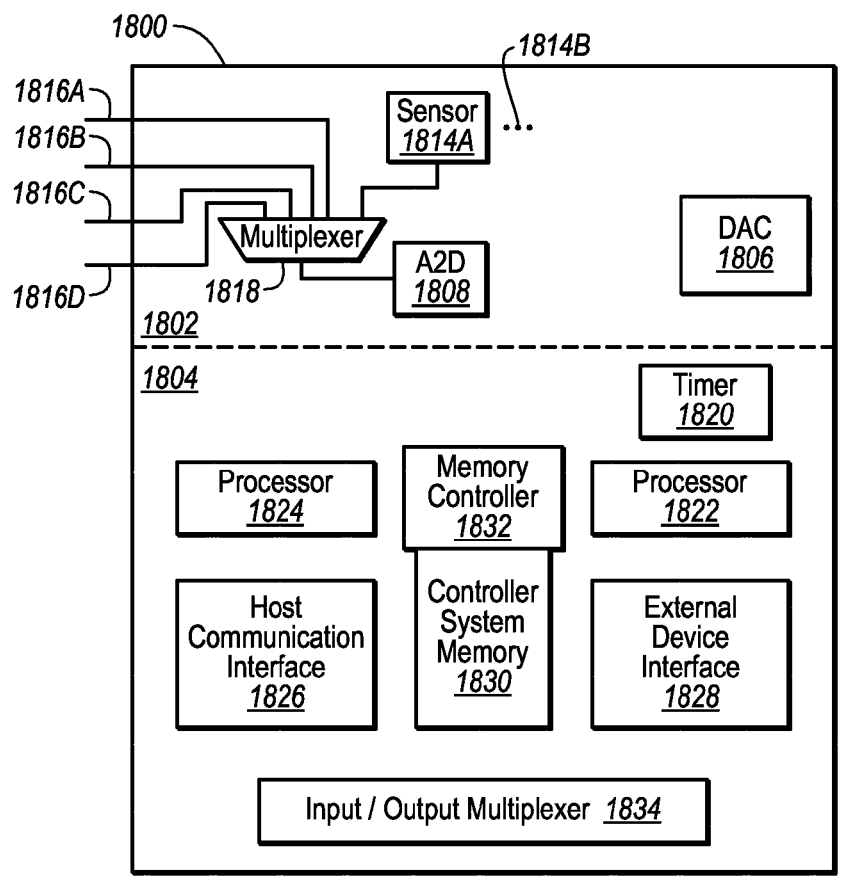
FIG. 18 is a diagram of a microcontroller that can be implemented in embodiments of the invention.

With reference now to FIG. 18, one embodiment 1800 of a microcontroller is illustrated that can be integrated within an intelligent transmitter module or implemented in conjunction therewith. In the embodiment illustrated in FIG. 18, the microcontroller 1800 can include both an analog portion 1802 and a digital portion 1804 that together allow the microcontroller to implement logic digitally, while still largely interfacing with other components (e.g., a transmitter, etc.) using analog signals.

The analog portion 1802 may contain digital to analog converters ("DACs") 1806, analog to digital converters ("A2Ds") 1808, high speed comparators (e.g., for event detection), voltage based reset generators, voltage regulators, voltage references, a clock generator, and other analog components. The analog portion 1802 may also include sensor 1814A amongst potentially others as represented by the horizontal ellipses 1814B. Each of these sensors may be responsible for measuring operational parameters such as, for example supply voltage and transceiver temperature. The microcontroller 1800 may also receive external analog signals from a laser with managed chirp or other component in order to monitor the laser with managed chirp. Four external lines 1816A, 1816B, 1816C and 1816D are illustrated for receiving such external analog signals, although there may be many of such lines. According to one embodiment of the invention, each of the external lines receives one of the photocurrents from the photodiodes 1706, 1708 or one of the temperatures from the thermistors 1712, 1714 of FIG. 17.

The internal sensors 1814A through 1814B may generate analog signals that represent the measured values. In addition, the externally provided signals 1816A through 1816D may also be analog signals. In this case, the analog signals are converted to digital signals so as to be available to the digital portion 1804 of the controller 1800 for further processing. Of course, each analog parameter value may have its own A2D. However, to preserve chip space, each signal may be periodically sampled in a round robin fashion using a single A2D such as the illustrated A2D 1808. In this case, each analog value may be provided to a multiplexer 1818, which selects in a round robin fashion, one of the analog signals at a time for sampling by the A2D 1808. Alternatively, multiplexer 1818 may be programmed to allow for any order of analog signals to be sampled by the A2D 1808.

The digital portion 1804 of the control module 1800 may include a timer module 1820 that provides various timing signals used by the digital portion 1804. Such timing signals may include, for example, programmable processor times. The timer module 1820 may also act as a watchdog timer or countdown timer.

Two general purpose processors 1822 and 1824 are also included. The processors recognize instructions that follow a particular instruction set, and may perform normal general-purpose operations such as shifting, branching, adding, subtracting, multiplying, dividing, Boolean operations, comparison operations, and the like. In one embodiment, the general-purpose processors 1822 and 1824 are each a 16-bit processor and may be identically structured. The precise structure of the instruction set is not important to the principles of the present invention as the instruction set may be optimized around a particular hardware environment, and as the precise hardware environment is not important to the principles of the present invention.

A host communication interface 1826 can optionally be implemented to communicate with a host using, for example, serial data (SDA) and serial clock (SCL) lines of an I$^2$C interface, although other interfaces, including SPI, MDIO, 1-wire, and the like may also be used. An external device interface 1828 can be implemented to communicate with other modules within an intelligent transmitter module such as the integrated CDR and VCSEL driver and/or linear amplifier as well as to communicate with other modules within an optical transceiver or transponder, such as a post-amplifier, and the like.

The internal controller system memory 1830 may be random access memory (RAM) or nonvolatile memory. While system memory 1830 may be RAM, it may also be a processor, register, flip-flop or other memory device. The memory controller 1832 shares access to the controller system memory 1830 amongst each of the processors 1822, 1824, the host communication interface 1826 and the external device interface 1828. According to one embodiment of the invention, information can be logged within the system memory 1830 and later retrieved for diagnosing an intelligent transmitter module or other device within which the microcontroller 1800 is implemented.

An input/output multiplexer 1834 multiplexes the various input/output pins of the microcontroller 1800 to the various components within the microcontroller 1800. This enables different components to dynamically assign pins in accordance with the then-existing operational circumstances of the microcontroller 1800. Accordingly, there may be more input/output nodes within the microcontroller 1800 than there are pins available on the microcontroller 1800, thereby reducing the footprint of the microcontroller 1800.

As previously mentioned, the microcontroller 1800 can be implemented on its own IC within an optoelectronic device or can be integrated on the same IC as an integrated CDR and driver and/or linear amplifier. Integrating the microcontroller into an IC with these other components is not simply a matter of fabricating a conventional microcontroller on the same die as a conventional CDR, driver, and/or linear amplifier. For instance, high speed signals within the digital core 1804 can interfere with functions performed by the aforementioned components. Additionally, noise from the driver can interfere with the analog portion 1802. For this reason, the analog and or digital portions of the microcontroller 1800 may be capacitively coupled and/or ground separation can be provided.

Additionally, when implemented in conjunction with a laser with managed chirp or other transmitters for high speed (e.g., 10 G and higher) and long haul optical communication, functionality and capabilities beyond those currently offered by conventional microcontrollers can be included in the microcontroller. For instance, proper operation of a laser with managed chirp at high speeds can involve rapid and repetitious reading of the temperatures of one or more TECs, reading the photocurrent from two or more photodiodes, updating the driver to maintain a particular extinction ratio, communicating with the CDR to ensure data flow, communicating with a TCC circuit to adjust gain, and the like. Accordingly, the microcontroller can include two processors 1824, 1822 that enable proper processing of incoming and outgoing control data. For example, in some embodiments, one of the processors can handles all high speed processes while the other processor handles all low speed processes in the background.

In some instances, proper operation of the laser with managed chirp may include measuring the temperature of the TECs to an accuracy of ±0.01 degrees Celsius. However, conventional microcontrollers are only able to measure temperature to an accuracy of approximately ±3 degrees Celsius because the A2Ds used only have 10-bit resolution. Accordingly, embodiments of the invention can implement a 14-bit or higher A2D, although not required in all embodiments. Alternately or additionally, relative to a general purpose microcontroller, the microcontroller 1800 can be simplified in some respects to optimize its functionality within an intelligent transmitter module.

The integration of one or more electronic components (including the CDR, driver, linear amplifier, and microcontroller) within an intelligent transmitter module can result in the removal of these components from their conventional location on a PCB, thereby freeing up real estate on the PCB. As described in greater detail above, various other components can be implemented in a transceiver, transponder, or other communications module using the additional real estate made available by using an ITM. These other components may include one or more of an FPGA, a digital signal processor, a memory chip, a digital diagnostic IC, a wireless and/or RF interface for interoperability communications (e.g., RF on fiber), video electronic circuitry, a VOA, an SOA, an optical MUX and/or DEMUX, and optical monitoring device, a polarization controller, and the like or any combination thereof.

The embodiments described herein may include the use of a special purpose or general-purpose computer including various computer hardware or software modules, as discussed in greater detail below.

Embodiments within the scope of the present invention also include computer-readable media for carrying or having computer-executable instructions or data structures stored thereon. Such computer-readable media can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium which can be used to carry or store desired program code means in the form of computer-executable instructions or data structures and which can be accessed by a general purpose or special purpose computer. When information is transferred or provided over a network or another communications connection (either hardwired, wireless, or a combination of hardwired or wireless) to a computer, the computer properly views the connection as a computer-readable medium. Thus, any such connection is properly termed a computer-readable medium. Combinations of the above should also be included within the scope of computer-readable media.

Computer-executable instructions comprise, for example, instructions and data which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used herein, the term "module" or "component" can refer to software objects or routines that execute on the computing system. The different components, modules, engines, and services described herein may be implemented as objects or processes that execute on the computing system (e.g., as separate threads). While the system and methods described herein are preferably implemented in software, implementations in hardware or a combination of software and hardware are also possible and contemplated. In this description, a "computing entity" may be any computing system as previously defined herein, or any module or combination of modulates running on a computing system.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optoelectronic device having one or more optical components and one or more electrical components, the device comprising:
    a device housing surrounding:
        an intelligent transmitter module including:
            a clock and data recovery circuit for receiving, equalizing, and retiming an electrical data signal;
            a driver operably connected to the clock and data recovery circuit and configured to generate a modulation signal from the electrical data signal;
            a laser operably connected to the driver and configured to emit an optical data signal representative of the electrical data signal; and
            one or both of:
                a linear amplifier operably connected between the driver and the laser, the linear amplifier configured to receive and amplify the modulation signal; and
                a microcontroller configured to control operation of the intelligent transmitter module,
            wherein the clock and data recovery circuit, the driver, and the linear amplifier are integrated into an integrated package;
        a printed circuit board positioned outside the integrated package and operably connected to the intelligent transmitter module for carrying the electrical data signal to the intelligent transmitter module; and
        coupled to the printed circuit board, one or more of: a field programmable gate array for performing one or more programmable functions in the optoelectronic device; a digital signal processor for processing the electrical data signal; a memory chip; a video integrated circuit; a wireless interface for receiving a wireless data signal and generating the electrical data signal therefrom; a radio frequency interface for receiving a radio frequency data signal and generating the electrical data signal therefrom; a variable optical attenuator operably coupled to an optical output of the intelligent transmitter module for reducing a power of the emitted optical data signal; a semiconductor optical amplifier operably coupled to the optical output of the intelligent transmitter module for increasing the power of the emitted optical data signal; a polarization controller configured to control the polarization of the emitted optical data signal; and an optical power monitoring device configured to monitor the power of the emitted optical data signal,
    the optoelectronic device configured to comply with a size and power limitations of a standardized form factor or a telecommunication standard.

2. The optoelectronic device of claim 1, wherein the intelligent transmitter module is configured for transmitting optical signals distances exceeding 100 kilometers.

3. The optoelectronic device of claim 1, wherein the clock and data recovery circuit is optimized in a low-noise environment.

4. The optoelectronic device of claim 1, further comprising:
    a plurality of intelligent transmitter modules, and
    an optical multiplexer operably connected to an optical output of each of the plurality of intelligent transmitter modules and configured to multiplex a plurality of optical data signals received from the plurality of intelligent transmitter modules into a multiplexed optical data signal.

5. The optoelectronic device of claim 1, further comprising a digital diagnostic integrated circuit coupled to the printed circuit board and configured to generate monitoring and operating data for the optoelectronic device.

6. The optoelectronic device of claim 1, wherein the integrated package includes a faraday cage.

7. The optoelectronic device of claim 1, further comprising a thermal chirp compensation circuit coupled between the laser and the clock and data recover circuit.

8. An optoelectronic device comprising:
    an intelligent transmitter module for receiving a first electrical signal and emitting an optical signal representative of the first electrical signal including:
        a first substrate having bonded thereto a first integrated circuit, a thermal chirp compensation circuit, and a linear amplifier integrated circuit, the first integrated circuit including an equalization and retiming stage optimized in a low-noise environment and a driver stage; and
        a second substrate, substantially distinct from the first substrate, having manufactured thereon an optical signal source with managed chirp, wherein the optical signal source is operably connected to the linear amplifier integrated circuit,
        wherein the first substrate, the first integrated circuit, the linear amplifier integrated circuit, the second substrate, and the optical signal source are integrated into a faraday cage;
    a receiver optical subassembly positioned outside of the integrated package for receiving an optical signal and converting the optical signal to a second electrical signal; and a printed circuit board operably connected to the intelligent transmitter module and the receiver optical subassembly and configured to carry the first electrical signal from a host to the intelligent transmitter module and to carry the second electrical signal from the receiver optical subassembly to the host, wherein the printed circuit board includes thereon a post amplifier for amplifying the second electrical signal.

9. The optoelectronic device of claim 8, further comprising one or more of:
a field programmable gate array coupled to the printed circuit board and configured to be programmed by a user or manufacturer of the optoelectronic device;
a memory chip coupled to the printed circuit board for storing one or more of: microcode, information identifying the optoelectronic device, and operational settings of the optoelectronic device;
a polarization controller coupled to an optical output of the intelligent transmitter module, the polarization controller configured for one or more of:
polarization mode dispersion compensation, polarization scrambling, polarization multiplexing, and a polarization generator;
a photodetector for monitoring the optical power output of the intelligent transmitter module; and
a variable optical attenuator coupled to the optical output of the intelligent transmitter module for adjustably attenuating the emitted optical signal, wherein the variable optical attenuator comprises a mechanical variable optical attenuator or a non-mechanical variable optical attenuator.

10. The optoelectronic device of claim 9, wherein:
the integrated package is positioned adjacent to the printed circuit board, and
the field programmable gate array, the memory chip, and a first semiconductor optical amplifier are included on the printed circuit board.

11. The optoelectronic device of claim 8, further comprising a digital diagnostic integrated circuit coupled to the printed circuit board, wherein the digital diagnostic integrated circuit facilitates one or more of the following functions for the optoelectronic device: device setup, device identification, eye safety and general fault detection, temperature compensation, monitoring of parameters relating to the optoelectronic device operating characteristics and environment, tracking an amount of time the optoelectronic device is powered on, and margining.

12. The optoelectronic device of claim 8, further comprising a video integrated circuit coupled to the printed circuit board and configured to process a video signal for transmission as an optical signal by the intelligent transmitter module, or to process a video signal received as an optical signal by the receiver optical subassembly, or any combination thereof, wherein the video integrated circuit comprises one or more of: a video decoder, a video encoder, a video noise-reduction FIFO, an LCD graphic display controller, a video FIFO, a video amplifier, and a video filter.

13. The optoelectronic device of claim 8, further comprising a wireless interface coupled to the printed circuit board for:
receiving a first wireless signal and generating the first electrical signal, wherein the first electrical signal is representative of the first wireless signal; and
receiving the second electrical signal and emitting a second wireless signal representative of the second electrical signal.

14. The optoelectronic device of claim 8, further comprising a radio frequency interface for:
receiving a first radio frequency signal and generating the first electrical signal, wherein the first electrical signal is representative of the first radio frequency signal; and
receiving the second electrical signal and generating a second radio frequency signal representative of the second electrical signal.

15. The optoelectronic device of claim 8, further comprising:
a first semiconductor optical amplifier coupled to the intelligent transmitter module and configured to boost the emitted optical signal; and
a second semiconductor optical amplifier coupled to the receiver optical subassembly and configured to pre-amplify the received optical signal.

16. The optoelectronic device of claim 8, wherein the intelligent transmitter module is configured for transmitting optical signals distances exceeding 100 kilometers.

17. The optoelectronic device of claim 8, wherein a clock and data recovery circuit included in the intelligent transmitter module is optimized in a low-noise environment.

18. The optoelectronic device of claim 8, further comprising:
a plurality of intelligent transmitter modules, and
an optical multiplexer operably connected to an optical output of each of the plurality of intelligent transmitter modules and configured to multiplex a plurality of optical data signals received from the plurality of intelligent transmitter modules into a multiplexed optical data signal.

19. The optoelectronic device of claim 8, wherein the optoelectronic device is configured to comply with a size and power limitation of a standardized form factor or a telecommunication standard.

* * * * *